United States Patent
Jans et al.

(10) Patent No.: US 10,418,913 B2
(45) Date of Patent: Sep. 17, 2019

(54) DC/DC RESONANT CONVERTERS AND POWER FACTOR CORRECTION USING RESONANT CONVERTERS, AND CORRESPONDING CONTROL METHODS

(71) Applicant: SIGNIFY HOLDING B.V., Eindhoven (NL)

(72) Inventors: William Peter Mechtildis Marie Jans, Born (NL); David Liewellyyn John, Willingham (GB); Reinhold Elferich, Aachen (DE); Johannes Hubertus Gerardus Op Het Veld, Roermond (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/075,778

(22) PCT Filed: Feb. 7, 2017

(86) PCT No.: PCT/EP2017/052634
§ 371 (c)(1),
(2) Date: Aug. 6, 2018

(87) PCT Pub. No.: WO2017/137389
PCT Pub. Date: Aug. 17, 2017

(65) Prior Publication Data
US 2019/0081565 A1    Mar. 14, 2019

(30) Foreign Application Priority Data
Feb. 12, 2016   (EP) .................................. 16155504

(51) Int. Cl.
*H02M 3/338*       (2006.01)
*H02M 1/42*        (2007.01)
(Continued)

(52) U.S. Cl.
CPC ....... *H02M 3/3382* (2013.01); *H02M 1/4241* (2013.01); *H02M 1/4258* (2013.01);
(Continued)

(58) Field of Classification Search
CPC .. H05B 41/2827; H05B 41/28; H05B 41/245; H05B 41/295; H05B 41/3925;
(Continued)

(56) References Cited

U.S. PATENT DOCUMENTS 6,437,994 B1   8/2002   Blom et al.
6,711,034 B2   3/2004   Duerbaum et al.
(Continued)

FOREIGN PATENT DOCUMENTS

WO   2013083678 A2   6/2013
WO   2016020213 A2   2/2016

*Primary Examiner* — Wei (Victor) Chan
(74) *Attorney, Agent, or Firm* — Daniel J. Piotrowski

(57) ABSTRACT

Various improvements are provided to resonant DC/DC and AC/DC converter circuit. The improvements are of particular interest for LLC circuits. Some examples relate to self-oscillating circuit and others relate to converter circuits with frequency control, for example for power factor correction, driven by an oscillator.

15 Claims, 19 Drawing Sheets

(51) Int. Cl.
*H03K 5/24* (2006.01)
*H05B 33/08* (2006.01)
*H02M 1/00* (2006.01)

(52) U.S. Cl.
CPC ....... *H03K 5/2472* (2013.01); *H05B 33/0815* (2013.01); *H02M 2001/0016* (2013.01); *Y02B 70/126* (2013.01); *Y02B 70/1433* (2013.01)

(58) Field of Classification Search
CPC .... H05B 33/0815; H05B 41/38; H05B 41/42; H02M 1/4241; H02M 7/53832; H02M 1/08; H02M 1/425; H02M 2001/0048; H02M 2001/0054; H02M 7/53835; H02M 7/53846
USPC .............. 315/307, 219, 209 R, 151, 158
See application file for complete search history.

(56) References Cited

U.S. PATENT DOCUMENTS

| | | |
|---|---|---|
| 8,729,830 B2 | 5/2014 | Elferich |
| 2007/0268729 A1 | 11/2007 | Choi et al. |
| 2013/0250628 A1 | 9/2013 | Lin et al. |
| 2014/0091718 A1 | 4/2014 | Brinlee |
| 2014/0160808 A1 | 6/2014 | Sato |
| 2014/0217897 A1* | 8/2014 | Fujita ................. H05B 33/0815 315/118 |

* cited by examiner

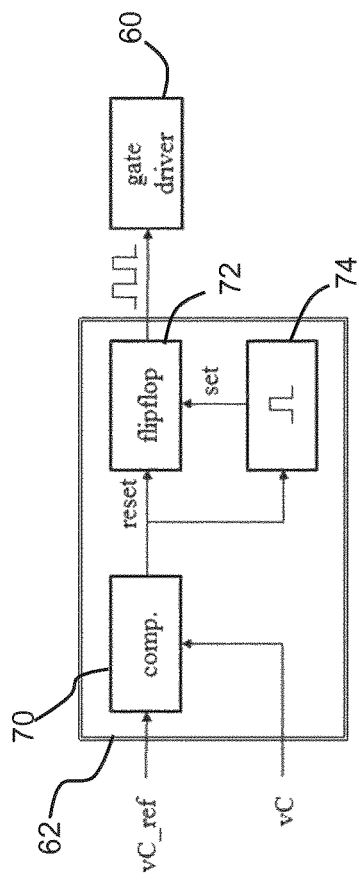
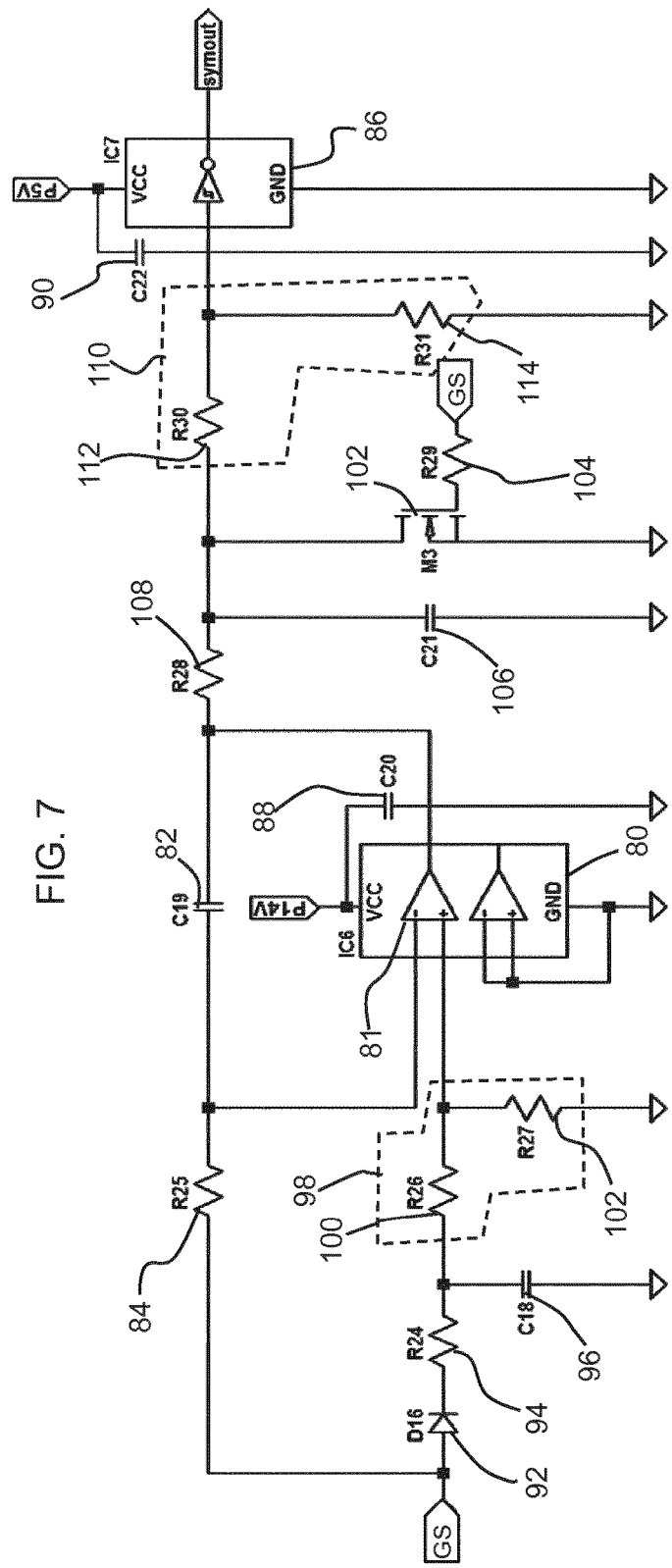
FIG. 7
FIG. 8

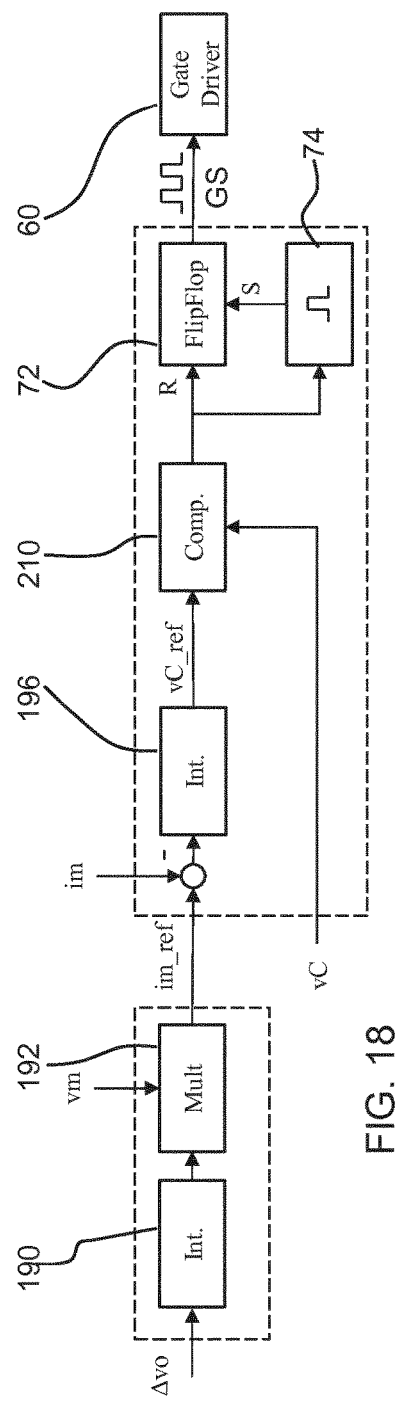
FIG. 18
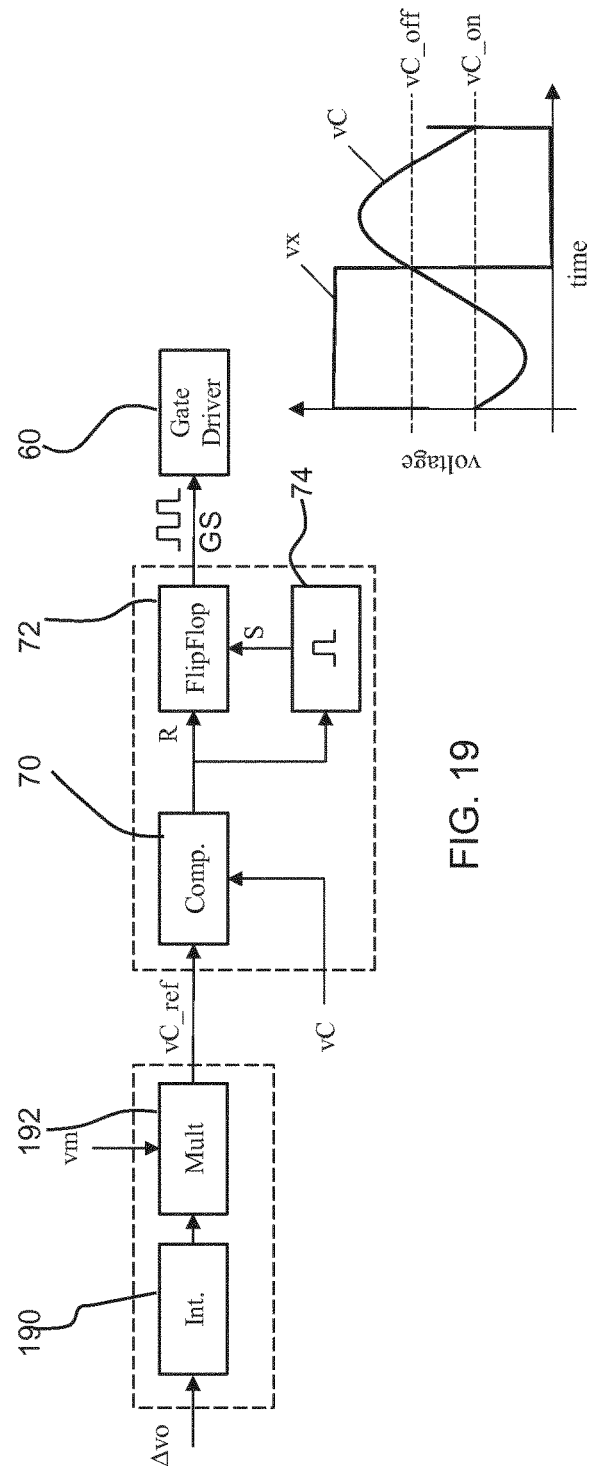
FIG. 19
FIG. 20

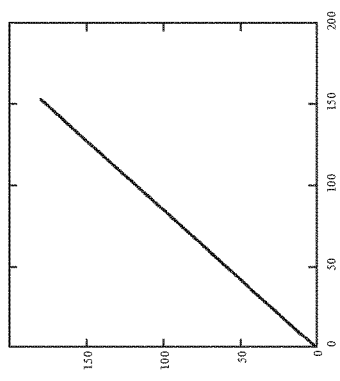
FIG. 21
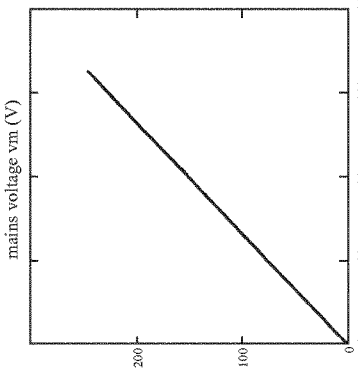
FIG. 22
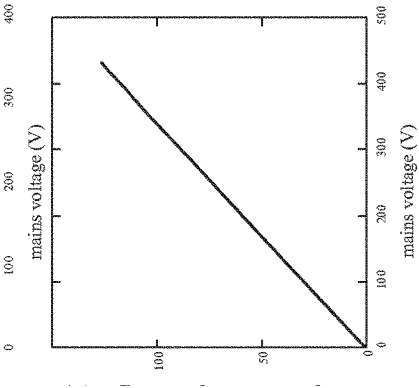
FIG. 23
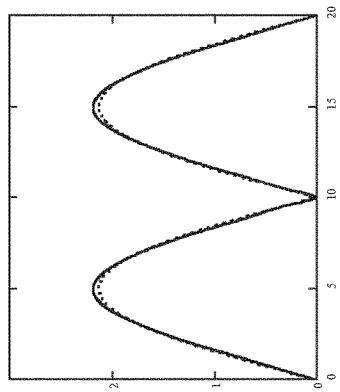
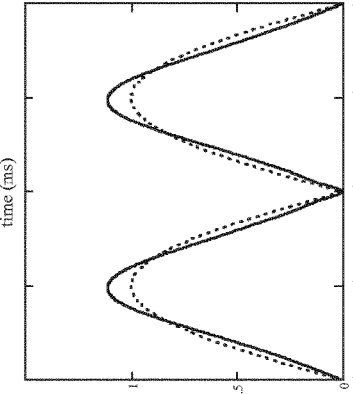
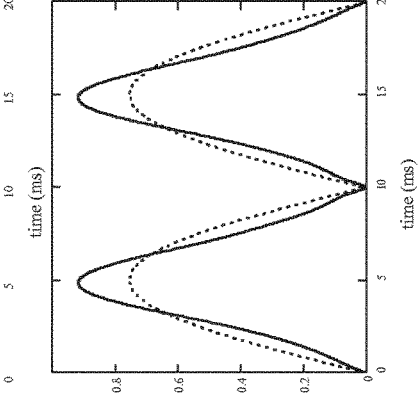

DC/DC RESONANT CONVERTERS AND POWER FACTOR CORRECTION USING RESONANT CONVERTERS, AND CORRESPONDING CONTROL METHODS

CROSS-REFERENCE TO PRIOR APPLICATIONS

This application is the U.S. National Phase application under 35 U.S.C. § 371 of International Application No. PCT/EP2017/052634, filed on Feb. 7, 2017 which claims the benefit of European Patent Application No. 16155504.0, filed on Feb. 12, 2016. These applications are hereby incorporated by reference herein.

FIELD OF THE INVENTION

This invention relates to the use of resonant power converters to provide AC/DC conversion with power factor correction, or to provide DC/DC conversion. The invention relates in particular to the use of LLC converters.

BACKGROUND OF THE INVENTION

Converters which are in the form of so-called resonant converters have a resonant circuit, which can be a series or parallel resonant circuit. When configuring converters, one aim is to keep losses low. Resonant converters which comprise an LLC resonant circuit having two inductances and one capacitance are well-known. Such converters have the advantage that energy-efficient operation with relatively low switching losses is possible.

Resonant LLC converters are well known for use within LED drivers. The converters can be configured or operated as a constant current source or a constant voltage source. A constant current source can be used to drive an LED arrangement directly, thus enabling a single stage driver. Constant voltage sources can be used, for example, for LED modules which have further driver electronics in order to ensure a corresponding power supply to the LEDs with a predetermined current from the output voltage provided by the constant voltage source.

The LLC converter comprises a switching arrangement (called the inverter switch) for controlling the conversion operation, and the switching is controlled using feedback or feedforward control, in order to generate the required output.

Another function implement within a power converter which is supplied with mains (or other AC) power is power factor correction (PFC). The power factor of an AC electrical power system is defined as the ratio of the real power flowing to the load to the apparent power in the circuit. A power factor of less than one means that the voltage and current waveforms are not in phase, reducing the instantaneous product of the two waveforms. The real power is the capacity of the circuit for performing work in a particular time. The apparent power is the product of the current and voltage of the circuit. Due to energy stored in the load and returned to the source, or due to a non-linear load that distorts the wave shape of the current drawn from the source, the apparent power will be greater than the real power.

If a power supply is operating at a low power factor, a load will draw more current for the same amount of useful power transferred than for a higher power factor.

The power factor can be increased using power factor correction. For linear loads, this may involve the use of a passive network of capacitors or inductors. Non-linear loads typically require active power factor correction to counteract the distortion and raise the power factor. The power factor correction brings the power factor of the AC power circuit closer to 1 by supplying reactive power of opposite sign, adding capacitors or inductors that act to cancel the inductive or capacitive effects of the load.

Active PFC makes use of power electronics to change the waveform of the current drawn by a load to improve the power factor. Active PFC circuits may for example be based on buck, boost or buck-boost switched mode converter topologies. Active power factor correction can be single-stage or multi-stage.

In the case of a switched mode power supply, a PFC boost converter is for example inserted between the bridge rectifier and the mains storage capacitor. The boost converter attempts to maintain a constant DC bus voltage on its output while drawing a current that is always in phase with and at the same frequency as the line voltage. Another switched-mode converter inside the power supply produces the desired output voltage or current from the DC bus.

Due to their very wide input voltage range, many power supplies with active PFC can automatically adjust to operate on AC power for example from about 110 V to 277V.

Power factor correction may be implemented in a dedicated power factor correction circuit (called a pre-regulator), for example placed between the (mains) power supply and the switch mode power converter which then drives the load. This forms a dual stage system, and this is the typical configuration for high power LED applications (for example more than 25W). The power factor correction may instead be integrated into the switch mode power converter, which then forms a single stage system.

In this case, there is a single resonant tank and switching arrangement, which then implements both power factor correction as well as control of the conversion ratio between the input and output in order to maintain the desired output (current in the case of an LED driver) delivered to the load.

Active power factor correction typically involves providing the input current and voltage waveforms to a controller so that their relative phase angle may be controlled by adjusting the load.

It has been proposed in US 2014/0091718 to use an LLC DC/DC converter, preceded by a rectifier, as a PFC circuit. The LLC resonant converter is frequency controlled, for which an oscillator is used. The control value of the feedback control system is the inverter's switching frequency. Self-oscillating resonant converter circuit are also known which make use of internal components to form a resonant tank, and signal values (e.g. voltage levels which arise in the circuit) are used to implement switching operations. For example, U.S. Pat. No. 8,729,830 discloses the control of a resonant DC/DC converter in a self-oscillating manner, by using threshold detection of states in the resonant tank in order to determine the inverter switching times rather than employing an oscillator and frequency control.

LLC DC/DC converters are either operated at a DC supply voltage (e.g. 48V in telecommunications or data center applications), or they are used as the second stage of a mains power supply or two stage LED driver, in which the front end stage (the power factor correction pre-regulator) provides the power factor correction and also generates a stabilized bus voltage that forms the DC input voltage for the LLC.

Standard power factor pre-regulators with medium and low output power are realized by buck, boost, buck-boost or flyback converters operating in boundary conduction mode (or 'critical conduction mode'). A flyback converter is typically used if the converter has to be mains isolated. This operation mode is widely used in all kinds of commercial products which have to meet mains harmonic regulations. Typically, for the control of these converters two concepts are used:

(i) Peak current mode control in combination with a multiplier of the mains input voltage for providing a setpoint of the mains input current. Here, the input current is closed-loop controlled and has to be measured by means of a current sensor.

(ii) Constant on-time operation of the inverter switch. This approach does not control the mains input current in a closed loop and the control system is very simple to realize. This approach neither needs a multiplier to calculate a set point nor a current sensor. This approach is based on a constant on-time, and the mains input current is roughly proportional to the mains voltage (under certain design and operation conditions).

This invention relates in some aspects to DC/DC resonant converter architectures and in other aspects to resonant LLC converters employed as an AC/DC converter implementing power factor correction (PFC).

An example of a resonant AC/DC converter is shown in FIG. 1. The LLC resonant circuit forms a PFC stage and may thus be used as a PFC pre-regulator by having a controlled output voltage. It could also be used as a single stage LED driver by having a controlled output current.

The circuit comprises a mains input 10 which is followed by a rectifier bridge 12 having a smoothing capacitor 14 at the output. The converter comprises a primary-side circuit 16 and a secondary side 18.

There is electrical isolation between the primary-side circuit 16 and the secondary side 18. A transformer comprising a primary coil 20 and a secondary coil 22 is provided for the isolation. The transformer has a magnetizing inductance 20 which also acts as one of the inductances of a series LLC resonant circuit. The LLC resonant circuit has a second inductance 24, and a capacitance (formed as two capacitors 26 and 27 in this example).

In an LLC circuit, the inductances and capacitor may be in any series order. The inductor may comprise discrete components or it may be implemented as leakage inductances of the transformer.

The primary-side circuit 16 comprises a half-bridge having a first power switch 28 and a second power switch 30. The first switch and the second switch can be identical, and the half-bridge can be in the form of a symmetrical half-bridge. These switches can be in the form of field-effect transistors. The resonant LLC circuit is connected to a node between the two switches.

Each switch has its timing of operation controlled by its gate voltage (shown schematically as a voltage source). Feedback is used to determine the timing of the control of the switches 28, 30.

During operation of the converter, a controller controls the switches, at a particular frequency and in complementary manner.

The circuit shown in FIG. 1 is thus an AC/DC PFC single stage converter, comprising an AC input 10, a rectifier 12, a half bridge inverter comprising a high side switch (the first power switch 28) and a low side switch (the second power switch 30), wherein an output is defined from a node between the switches. The self-oscillating LLC circuit 20,24,26,27 is coupled to the output. A control circuit (not shown) is used for generating a gate drive signal for controlling the switching of the high side and low side switches. A high gate drive signal turns on one switch and turns off the other switch and a low gate drive signal turns off the one switch and turns on the other switch.

In one known approach, the primary-side circuit 16 detects a variable which indicates an average value over time of a current flowing in the circuit, for example through the first or second switch. Information about the load is derived on the basis of the measured current in the primary-side circuit. The measured current may have a direct relationship with the load.

The secondary side 18 has a rectifier which is connected downstream of the secondary coil 22 and which can be formed, for example, by a first diode arrangement 32 (of diodes 32a and 32b) and a second diode arrangement 34 (of diodes 34a and 34b). FIG. 1 shows a full-bridge rectifier and a single secondary coil which couples at its ends to the rectifier circuit. Instead, a center of the secondary coil 22 may be coupled to an output of the secondary-side circuit. The ends of the secondary coil 22 may then be coupled to the output via a half bridge rectifier with only two diodes. The storage capacitor 36 is connected between the outputs of the rectifier. The LED load or other output stage is represented by a resistor. It comprises an LED or a plurality of LEDs.

A control scheme is required to drive the switches 28, 30 into their on- and off-states such that the output voltage or current is regulated to a certain desired value or range of values and for a PFC circuit also to implement power factor correction.

In order to exploit best the powertrain and to achieve the maximum efficiency, it is desired to operate the converter symmetrically (at least at full load) and to load the transformer and the rectifier in the secondary side equally. In the case of a transformer with center-tapped output windings that are symmetric in terms of turn-ratios and leakages, secondary side symmetry can be assured if the duty cycle of the half-bridge (i.e., its switch node) is kept at 50%.

There are basically four transitions that the control scheme must handle:
1. Turn-on of the high-side MOSFET 28;
2. Turn-on of the low-side MOSFET 30;
3. Turn-off of the high-side MOSFET 28;
4. Turn-off of the low-side MOSFET 30.

There are several known schemes that may be used in order to achieve this.

A. Von-Voff is a control scheme where transition number 4 is initiated when some state variable crosses a certain threshold voltage (Von). Following this, the control waits for a certain time (i.e., the dead-time) before starting transition 1. This dead-time ensures that cross-conduction, or shoot-through, does not occur. The half-bridge is now in the on-state. Eventually, either the same or a different state variable will cross a second threshold (Voff), and transition number 3 will be initiated. As with the transition to the half-bridge on-state, there will then be a dead-time before transition number 2 is initiated. The half-bridge is now in the off-state, and then the procedure continues from the beginning once more. The actual values of the two thresholds are determined by an outer control loop in order to yield the correct output. This is a Von-Voff scheme in that voltage threshold controls the switching on and off.

B. Von-Ton is a control scheme where transition number 4 is initiated when some state variable crosses a certain threshold voltage (Von). As in case A, the dead-time is allowed to pass before starting transition number 1. Transition number 3 is initiated based on a certain time interval elapsing. This may be a fixed interval, or a controlled interval. After the dead-time has then elapsed, transition number 2 is initiated, and then the procedure continues from the beginning once more. The actual value of the voltage threshold is determined by an outer control loop in order to yield the correct output, and the time threshold may be fixed or controlled dynamically. This is a Von-Ton scheme in that a voltage threshold controls the turning on (after a dead time) and the time duration of the on period of the half bridge is then controlled.

C. Voff-Toff is similar to case B, except that the voltage and time thresholds define the off and on transitions of the half-bridge, respectively. Transition number 3 is initiated when some state variable crosses a certain threshold voltage (Voff). The dead-time is allowed to pass before starting transition number 2. Transition number 4 is initiated based on a certain time interval elapsing. After the dead-time has then elapsed, transition number 1 is initiated, and then the procedure continues from the beginning once more. As in case B, the actual value of the voltage threshold is determined by an outer control loop in order to yield the correct output, and the time threshold may be fixed or controlled dynamically. This is a Voff-Toff scheme in that a voltage threshold controls the turning off and the time duration of the off period of the half bridge is controlled (i.e. between turning off the high-side MOSFET and turning it on again after the time duration and dead-time).

In cases B and C, it is most often desirable to control the on (off) time such that it matches the off (on) time, i.e., it is usually beneficial to operate with a 50% duty cycle as mentioned above. In other cases, it is beneficial to operate with a defined duty cycle that is different from 50% in order to enlarge the output voltage or current window that the converter is capable of handling.

For threshold-based resonant converters (such as a self-oscillating LLC converters), there is no oscillator present in the circuit. Threshold-based switching has a particular advantage with regards to the linearity of the transfer function when using the converter to cover a wide range of input and output operating conditions, such as in an LLC PFC for example, and frequency control is not feasible in such cases due to extreme variations in the gain that cannot easily be handled.

This invention relates to improvements to the design and control of resonant LLC converter circuits and in particular for use as PFC pre-regulator circuits, although some aspects also apply to DC/DC converters, and some aspects also apply to single stage PFC drivers. Some aspects are also not limited to LLC circuits.

WO 2016/020213 discloses a driver device for driving a load, in particular for driving an LED unit comprising one or more LEDs. The driver device comprises input terminals for connecting the driver device to an electrical power supply for receiving a variable input voltage from the electrical power supply, a converter unit for converting the input voltage to an output voltage including a resonant converter and a switch unit, wherein the switch unit is adapted to provide a chopped voltage of the input voltage as a drive voltage to the resonant converter, and a control unit connected to the switch unit for controlling a pulse frequency of the chopped voltage, wherein the control unit is adapted to control an input current drawn from the electrical power supply by controlling the pulse frequency of the chopped voltage on the basis of a measured value of the variable input voltage.

SUMMARY OF THE INVENTION

The invention is defined by the claims.

According to a first set of examples there is provided an AC/DC PFC single stage converter, comprising:
an AC input;
a rectifier;
a half bridge inverter comprising a high side switch and a low side switch, wherein an output is defined from a node between the switches;
a self-oscillating LLC circuit coupled to the output, wherein an electrical feedback parameter is provided by the LLC circuit; and
a control circuit for generating a gate drive signal for controlling the switching of the high side and low side switches in dependence on the electrical feedback parameter, wherein a high gate drive signal turns on one switch and turns off the other switch and a low gate drive signal turns off the one switch and turns on the other switch,
wherein the control circuit comprises an outer control loop for setting a threshold level for the electrical feedback parameter in dependence on the converter output voltage or current and the rectified input voltage and current, and an inner control loop for comparing the electrical feedback parameter with the threshold to derive the gate drive signal,
wherein the inner control loop comprises a comparator for comparing the electrical feedback parameter with the threshold and a flip flop for generating the gate drive signal.

This aspect provides a single stage circuit which implements PFC based on measurement of the input current and voltage, and which applies threshold control to control the switching of the half bridge inverter.

In one example, the comparator output is provided to the reset input of the flip flop and the set input is provided by a delay element. This enables a single threshold to be used to control the self-oscillation. The delay element may provide a delay which is triggered by the reset input.

In another example, the control circuit is adapted to set a first threshold of the electrical feedback parameter for turning on the gate drive signal and a second threshold of the electrical feedback parameter for turning off the gate drive signal This approach avoids the need for a balancing controller to complete the timing control, as is required for control based on a single threshold.

This set of examples also provides a single stage PFC AC/DC conversion method, comprising:
rectifying an AC input;
operating a half bridge inverter comprising a high side switch and a low side switch using a gate drive signal and providing an output from a node between the switches, wherein a high gate drive signal turns on one switch and turns off the other switch and a low gate drive signal turns off the one switch and turns on the other switch;
providing an electrical feedback parameter from a self-oscillating LLC circuit coupled to the output; and
controlling the switching of the high side and low side switches based on the electrical feedback parameter by:
using an outer control loop for setting a threshold level for the electrical feedback parameter in dependence on the converter output voltage or current and the rectified input voltage and current; and
using an inner control loop to compare the electrical feedback parameter with the threshold to derive the gate drive signal, and generating the gate drive signal using a flip flop.

A first threshold of the electrical feedback parameter for turning on the gate drive signal may be used and a second threshold of the electrical feedback parameter for turning off the gate drive signal may be used.

According to a second set of examples there is provided an AC/DC PFC converter, comprising:
- an AC input;
- a rectifier;
- a half bridge inverter comprising a high side switch and a low side switch, wherein an output is defined from a node between the switches;
- a self-oscillating LLC circuit coupled to the output, wherein an electrical feedback parameter is provided by the LLC circuit;
- a control circuit for generating a gate drive signal for controlling the switching of the high side and low side switches in dependence on the electrical feedback parameter, wherein a high gate drive signal turns on one switch and turns off the other switch and a low gate drive signal turns off the one switch and turns on the other switch, wherein the control circuit is for:
  - determining a value relating to a first time duration corresponding to an on-time or an off-time of the high side switch or the low side switch as determined by the electrical feedback parameter, and
  - defining a second time duration for setting the subsequent off-time or on-time, respectively.

This arrangement enables a single feedback parameter to be used to define the on-time (or off-time) of the switch arrangement, and with control of the duty cycle.

The time duration resulting from the threshold control is measured, and this time duration (or multiple previous time durations) is used to determine the duration of the next phase of the control cycle, The control circuit may for example generate a signal that represents a (moving) average of the preceding durations (e.g. from the past 5 to 100 cycles).

In this way, one switching transition reacts directly to a threshold whereas the other is subject of an inner control which has a set point (e.g. 50%), a means to detect the error to the set point, an error integrator and way to control the duration.

Thus, in one example, an integrator may be used to integrate first constant value until the electrical feedback parameter reaches a threshold value, and then integrate a second constant value of opposite sign.

This provides an analogue solution for the timing control, in which an integrator is used to measure the time duration, by integrating a constant value. To set the corresponding on-time or off time of the other switch, an opposite sign signal is integrated in order to define a second time duration. The duty cycle can be accurately set to 50% in this way, in that the duty cycle itself can be used to set the time periods, by suitable selection of the constant values to be integrated.

The constant values for example are derived from the gate drive signal. This gate drive signal alternates between two values—one of which is positive compared to a reference and the other of which is negative compared to the reference, thereby defining the first and second constant values.

The integrator may thus have a reference input set to a fixed voltage within the range of the gate drive signal. This determines the switching instants of the integrator, and it enables any desired duty cycle to be set.

The integrator may have the reference input set to the mid-point of the gate drive signal. This enables a 50% duty cycle to be set as mentioned above.

The converter may further comprise an RC output filter at the output of the integrator.

The integrator component values may be used to set a low-frequency cut off of the bandwidth of operation, and the RC output filter may be used to set a high-frequency cut off.

The converter may further comprise a shorting transistor at the output of the RC output filter, which is turned on when the integrator output is a falling slope and is turned off when the integrator output is a rising slope. This means the output of the control circuit can be provided as a pulse when the correct timing (for the desired duty cycle) has been reached.

This set of examples also provides an AC/DC PFC conversion method, comprising:
- rectifying an AC input;
- operating a half bridge inverter comprising a high side switch and a low side switch using a gate drive signal and providing an output from a node between the switches, wherein a high gate drive signal turns on one switch and turns off the other switch and a low gate drive signal turns off the one switch and turns on the other switch;
- providing an electrical feedback parameter from a self-oscillating LLC circuit coupled to the output, wherein an electrical feedback parameter is provided by the LLC circuit;
- controlling the switching of the high side and low side switches by:
  - determining a value relating to a first time duration corresponding to an on-time or an off-time of the high side switch or the low side switch as determined by the electrical feedback parameter, and
  - defining a second time duration for setting the subsequent off-time or on-time, respectively.

The method may comprise:
- integrating a first constant value until the electrical feedback parameter reaches a threshold value; and
- integrating a second constant value of opposite sign to the first constant value define a second time duration for setting the subsequent off-time or on-time, respectively.

The constant values may be derived from the gate drive signal and the method may comprise setting an integrator reference input to a fixed voltage within the range of the gate drive signal.

According to a third set of examples there is provided a converter, comprising:
- a half bridge inverter comprising a first switch and a second switch, wherein an output is defined from a node between the switches;
- a self-oscillating LLC circuit coupled to the output, wherein an electrical feedback parameter is provided by the self-oscillating LLC circuit, wherein at a first moment in time the electrical feedback parameter is equal to the value of the electrical feedback parameter threshold and wherein the slope of the electrical feedback parameter has a sign equal to that of the sign of the electrical feedback parameter threshold and at a second moment in time the electrical feedback parameter is equal to the value of the electrical feedback parameter threshold and wherein the slope of the electrical feedback parameter has a sign opposite to that of the sign of the electrical feedback parameter threshold;
- a control circuit for generating a gate drive signal for controlling the switching of the first switch and the second switch in dependence on a comparison between the electrical feedback parameter with a predefined electrical feedback parameter threshold, wherein a high gate drive signal turns on the first switch and turns off the second switch and a low gate drive signal turns off the first switch and turns on the second switch, wherein the control circuit comprises:

a detecting circuit for detecting a sign of a slope of the electrical feedback parameter; and a preventing circuit for preventing a change in the gate drive signal starting after the first moment in time and before the second moment in time and ending after the second moment in time and before the first moment in time.

In this circuit, an electrical feedback parameter is used as a control variable. When a threshold is reached, the control circuit may disable the feedback parameter. In this way, the feedback parameter no longer controls the switching function. This enables the electrical feedback parameter to increase beyond the threshold without unwanted false triggering being caused. The preventing may be considered to be a blanking operation, by which the feedback parameter is only sensed when the slope has the correct sign and the gate drive signal has the correct value. In this way, the threshold is used when the feedback parameter is approaching that threshold level and it is not used at other times when false triggers are likely.

The self-oscillating circuit preferably comprises an LLC circuit and the electrical feedback parameter comprises a voltage across a capacitor of the LLC circuit.

The preventing circuit may comprise a shorting circuit for shorting the sensed electrical feedback parameter to a reference potential. This renders the threshold control inactive.

In one example, the detecting circuit may comprise a bipolar transistor having its base connected to one terminal of an integrating capacitor, with the other terminal of the integrating capacitor connected to the feedback electrical signal, such that the base current is dependent on the slope of the voltage applied the integrating capacitor, such that in one mode the bipolar transistor is open circuit and in another mode it performs a pull up or pull down function.

In another example, the detecting circuit may comprise a buffer circuit having its input connected to one terminal of an integrating capacitor and to a diode arrangement, with the other terminal of the integrating capacitor connected to the feedback electrical signal, arranged such that a direction of current flow through the diode arrangement is dependent on the slope of the voltage applied to the integrating capacitor, such that in one mode the input to the buffer is pulled down and in another mode the input to the buffer is pulled up.

There are thus different ways to implement detection of the slope of the feedback parameter.

A logic arrangement may be provided for implementing an OR function between the slope of the electrical feedback parameter and the level of the gate drive signal.

An AC/DC PFC converter may comprise an AC input, a rectifier and a converter as defined above having as its input the output of the rectifier.

This set of examples also provides a conversion method, comprising:

operating a half bridge inverter comprising a first switch and a second switch using a gate drive signal and providing an output from a node between the switches, wherein a high gate drive signal turns on the first switch and turns off the second switch and a low gate drive signal turns off the first switch and turns on the second switch;

providing an electrical feedback parameter from a self-oscillating circuit coupled to the output;

controlling the switching of the first switch and the second switch in dependence on a comparison between the electrical feedback parameter with a predefined electrical feedback parameter threshold, by:

detecting a sign of a slope of the electrical feedback parameter; and disabling the electrical feedback parameter during a period of time, the period of time at least including the moment wherein the value of the electrical feedback parameter is equal to the value of the electrical feedback parameter threshold but wherein the slope of the electrical feedback parameter has a sign opposite to that of the value of the electrical feedback parameter threshold.

The disabling may comprise shorting the sensed electrical feedback parameter to a reference potential. The detecting may comprise controlling the base current of a bipolar transistor in dependence on the slope of the voltage applied to an integrating capacitor at the base of the bipolar transistor such that in one mode the bipolar transistor is open circuit and in another mode it performs a pull up or pull down function; or controlling a direction of current flow through a diode arrangement in dependence on the slope of the voltage applied to an integrating capacitor, such that in one mode an input to a buffer is pulled down and in another mode the input to the buffer is pulled up.

According to a fourth set of examples there is provided an AC/DC PFC converter, comprising:

an AC input;

a rectifier;

a half bridge inverter comprising a high side switch and a low side switch, wherein an output is defined from a node between the switches;

an LLC circuit coupled to the output, wherein a voltage across a capacitor of the LLC circuit is provided as an electrical feedback parameter, wherein the electrical feedback parameter is representative of the input current; and a control circuit for generating a gate drive signal for controlling the switching of the high side and low side switches in dependence on the electrical feedback parameter, wherein a high gate drive signal turns on one switch and turns off the other switch and a low gate drive signal turns off the one switch and turns on the other switch, wherein the control circuit comprises an outer control loop for setting a threshold level for the electrical feedback parameter in dependence on the converter output voltage or current and the rectified input voltage, without measurement of the input current, and an inner control loop for comparing the electrical feedback parameter with the threshold to derive the gate drive signal and to provide power factor correction.

This arrangement avoids the need to use a measured input current as an input to the control circuit, by using the electrical parameter from the LLC circuit to represent the input current. The desired PFC function is still able to give a virtually resistive input impedance.

The measurement of current is replaced with a more simple voltage measurement. This also eases the use of standard boost PFC controller integrated circuits.

The circuit may be a pre-regulator stage (to be followed by a DC/DC converter) or it may be implemented within a single stage driver. The LLC circuit may be self-oscillating or the half bridge inverter may be controlled by an oscillator.

The inner control loop is preferably for comparing the voltage across the capacitor of an LLC resonant circuit with the threshold at a switching instant of the gate drive signal. The circuit can be designed so that the input current is virtually proportional to the voltage across the LLC capacitor at the switching instants.

In one example, the inner control loop comprises an oscillator, and the inner control loop controls the oscillation frequency. This provides well-known frequency control for an LLC converter.

In another example, the inner control loop comprises a latch, wherein the timing of the latch switching is dependent on the electrical feedback parameter. This provides a self-resonant switching operation.

The latch may then comprise a flip flop, wherein one of the set and reset timings is controlled in dependence on the electrical feedback parameter and the other of the set and reset timings is controlled based on a fixed delay.

A correction unit may be provided for modifying the relationship between the threshold level for the electrical feedback parameter and the rectified input voltage to the circuit. This enables a power factor closer to unity to be obtained, and hence a lower total harmonic distortion.

The correction unit may be for:

modifying the threshold level for the electrical feedback parameter in dependence on the input voltage before the threshold level is compared with the electrical feedback parameter;

modifying the rectified input voltage before supplying it to the outer control loop; or modifying the measured electrical feedback parameter before comparing it with the threshold.

These are alternative ways to implement a change to the relationship between the threshold level and the rectified input voltage. The relationship between the threshold level for the electrical feedback parameter and the rectified input voltage to the circuit for example comprises a function with the same ratio between the threshold level and the input voltage for the minimum and maximum rectified input voltage, and a larger ratio for a mid-range rectified input voltage. This means the relationship deviates from a linear relationship, in particular in the mid-range voltage values.

This set of examples also provides an AC/DC PFC conversion method, comprising:

rectifying an AC input;

operating a half bridge inverter comprising a high side switch and a low side switch using a gate drive signal and providing an output from a node between the switches, wherein a high gate drive signal turns on one switch and turns off the other and a low gate drive signal turns off the one switch and turns on the other switch;

providing a voltage across a capacitor of an LLC circuit as an electrical feedback parameter which is representative of the input current;

controlling the switching of the high side and low side switches in dependence on the electrical feedback parameter, by:

setting a threshold level for the electrical feedback parameter in an outer control loop in dependence on the converter output voltage or current and the rectified input voltage without measurement of the input current; and comparing the electrical feedback parameter with the threshold in an inner control loop to derive the gate drive signal.

The method may comprise, in the inner control loop, comparing the voltage across the capacitor with the threshold at a switching instant of the gate drive signal. The inner control loop may be used to control an oscillator and thereby control the oscillation frequency of the gate drive signal. Alternatively, the inner control loop may be used to control the timing of the switching of a flip flop, by controlling one of the set and reset timings in dependence on the electrical feedback parameter and by controlling the other of the set and reset timings based on a fixed delay.

According to a fifth set of examples there is provided a converter, comprising:

a half bridge inverter comprising a high side switch and a low side switch, wherein an output is defined from a node between the switches;

an LLC circuit coupled to the output, wherein an electrical feedback parameter is provided by the LLC circuit;

a control circuit for generating a gate drive signal for controlling the switching of the high side and low side switches in dependence on the electrical feedback parameter, wherein a high gate drive signal turns on one switch and turns off the other switch and a low gate drive signal turns off the one switch and turns on the other switch, wherein the control circuit comprises an outer control loop for setting a threshold level in dependence on at least the converter output voltage or current, and an inner control loop comprising an oscillator for generating the gate drive signal, wherein the oscillator frequency is controlled by the inner control loop in dependence on the threshold level and on the electrical feedback parameter.

This arrangement makes use of an electrical parameter from the LLC circuit to supplement the oscillator control of the half bridge. The electrical parameter is used as the controlled (manipulated) variable. This provides a hybrid control approach, which makes use of an oscillator as well as feedback from the LLC circuit. This enables a more stable control, which does not suffer from false triggers or missing triggers. It functions as a time average threshold control approach. The circuit may be a pre-regulator PFC stage (to be followed by a DC/DC converter) or it may be implemented within a single stage driver, or it may be used in a DC/DC converter.

When used in a PFC circuit, the threshold level may be set based on a measurement of the input voltage and current. Alternatively, the input current may be represented by the voltage across a capacitor of the LLC circuit as in the fourth set of examples above.

In one set of examples, the threshold level is an input current threshold level, and the inner control loop comprises an integrator for integrating an input current error, wherein the oscillator is controlled in dependence on the integrated current error and the electrical feedback parameter. This combines input current control with control using electrical signals within the LLC tank.

In another set of examples, the threshold level is a threshold level for the electrical feedback parameter, and the inner control loop comprises a phase detector for detecting a phase difference between a signal having timing dependent on the threshold level and the electrical feedback parameter. This example makes use of the electrical feedback parameter both for threshold control for the outer control loop (which controls the output voltage or current) and for the inner control loop (which controls the PFC).

In this way, the electrical feedback parameter (e.g. the LLC capacitor voltage) is used as the control (or manipulating) value that controls the level of power that is instantly converted, as also in the example s above. A PFC application uses two cascaded control loops and a DC/DC converter uses only one.

The VCO and phase detector implements a further inner control loop so that the switching is not immediately (or directly) performed in response to the threshold detection, as happens in the second aspect above.

For example, the inner control loop may then comprise an integrator for integrating a phase error, wherein the oscillator is controlled in dependence on the integrated phase error. The inner control loop may then comprise a triangular signal generator for converting the oscillator control signal into a triangular waveform with timing determined by feedback of the gate drive signal. This enables a duty cycle to be controlled based on the switching thresholds applied to the triangular signal.

The oscillator may comprise circuitry for implementing duty cycle modification in dependence on the output load.

This set of examples also provides a conversion method, comprising:
- operating a half bridge inverter comprising a high side switch and a low side switch using a gate drive signal and providing an output from a node between the switches, wherein a high gate drive signal turns on one switch and turns off the other switch and a low gate drive signal turns off the one switch and turns on the other switch;
- providing an electrical feedback parameter from an LLC circuit coupled to the output; and
- controlling the switching of the high side and low side switches in dependence on the electrical feedback parameter, by:
  - setting a threshold level in dependence on at least the converter output voltage or current in an outer control loop; and
  - in an inner control loop which comprises an oscillator for generating the gate drive signal, setting an oscillator frequency in dependence on the threshold level and on the electrical feedback parameter.

This provides a time average threshold control method as explained above. The threshold level may be an input current threshold level, and the inner control loop comprises an integrator for integrating an input current error, wherein the method comprises controlling the oscillator in dependence on the integrated current error and the electrical feedback parameter. Alternatively, the threshold level may be a threshold level for the electrical feedback parameter, and the method comprises, in the inner control loop, detecting a phase difference between a signal having timing dependent on the threshold level and the electrical feedback parameter.

According to a sixth set of examples there is provided an AC/DC PFC converter, comprising:
- an AC input;
- a rectifier;
- a half bridge inverter comprising a high side switch and a low side switch, wherein an output is defined from a node between the switches;
- a self-oscillating resonant circuit coupled to the output; and
- a control circuit for generating a gate drive signal for controlling the switching of the high side and low side switches in dependence on an electrical feedback parameter in order to control the converter output voltage or current, wherein a high gate drive signal turns on one switch and turns off the other switch and a low gate drive signal turns off the one switch and turns on the other switch, wherein the control circuit comprises:
  - an input for receiving a threshold value for the electrical feedback parameter;
  - an output circuit for generating the gate drive signal based on a comparison of the electrical feedback parameter with the threshold; and
  - a timeout circuit for overriding the threshold if switching of the gate drive signal fails thereby to provide a restart signal for restarting switching of the gate drive signal.

This arrangement enables the required self-oscillation of the gate drive signal to be restarted if there is an interruption to the signal oscillation.

The control circuit may comprise an integrator for integrating an error in the desired converter output voltage or current to derive a comparison signal. This comparison signal will only reach a threshold if the oscillation has stopped.

The integrator for example comprises an amplifier with a capacitor in a negative feedback path, and the timeout circuit comprises a switch for shorting the capacitor.

The comparison signal then ramps above the threshold as the slow integration time constant is removed.

The timeout circuit may comprise a detector for detecting transitions in the gate drive signal and for closing the switch in the absence of transitions in the gate drive signal.

The restart signal may be provided repeatedly during light load operation. This provides a form of boost mode operation.

This set of examples also provides an AC/DC PFC conversion method, comprising:
- rectifying an AC input;
- operating a half bridge inverter comprising a high side switch and a low side switch using a gate drive signal and providing an output from a node between the switches, wherein a high gate drive signal turns on one switch and turns off the other and a low gate drive signal turns off the one switch and turns on the other switch;
- providing an electrical feedback parameter from a self-oscillating resonant circuit coupled to the output; and
- controlling the switching of the high side and low side switches by:
  - receiving a threshold value for the electrical feedback parameter;
  - generating the gate drive signal based on a comparison of the electrical feedback parameter with the threshold; and
  - overriding the threshold if switching of the gate drive signal fails thereby to provide a restart signal for restarting switching of the gate drive signal.

The method may comprise integrating an error in the desired converter output voltage or current to derive a comparison signal and wherein overriding the threshold comprises shorting the capacitor. Overriding the threshold may then comprise detecting transitions in the gate drive signal and closing the switch in the absence of transitions in the gate drive signal. The method is used in a self-oscillating control scheme, for example including an error integrator. In the case of an analog implementation, this uses a feedback capacitor. However, for a digital implementation, the overriding function may be implemented by resetting a digital error integrator.

In all examples above, the electrical feedback parameter may comprise a voltage across a capacitor of the LLC circuit. Alternatively, the transformer voltage, or the transformer input current can also be used.

In all examples, the AC/DC converter may be used to implement power factor correction. Other than where specified to be a single stage converter, it may comprise a pre-regulator which provides a regulated PFC output voltage, which is then for example provided to another stage, for example to form a dual stage converter. However, it may instead be used as a single stage converter, in which case the output may comprise a regulated current, for example for driving an LED load.

In all examples, a transformer may be provided between the resonant circuit (e.g. LLC circuit) and the output load. A lighting apparatus may then comprise an LED arrangement of one or more LEDs and the AC/DC PFC converter (either as a single stage driver or as the first stage of a dual stage driver), and the LED arrangement comprises the ultimate output load.

An LED driving method comprises providing the AC/DC PFC conversion and driving an LED load using the converted DC voltage. The LED load may be driven directly, for example with output current control, or it may be driven through another DC/DC converter stage.

BRIEF DESCRIPTION OF THE DRAWINGS

Examples of the invention will now be described in detail with reference to the accompanying drawings, in which:

FIG. 7 shows the controller in FIG. 6 in more detail for a single threshold voltage implementation;

FIG. 8 shows a circuit for controlling the on-transition of a half-bridge in a Voff-Toff control scheme;

FIG. 18 shows a control implementation including the known approach of feeding back the mains input current but using the capacitor voltage of a self-oscillating LLC;

FIG. 19 shows an approach that combines the use of the capacitor voltage as the reference signal and self-oscillating switching as used in FIG. 21;

FIG. 20 shows the capacitor voltage and the threshold voltages;

FIGS. 21 to 23 show mains current waveforms of a design resulting from the control of FIG. 17 or 19 as well as the set point for the resonant capacitor voltage;

DETAILED DESCRIPTION OF THE EMBODIMENTS

The invention provides various improvements to resonant DC/DC and AC/DC converter circuits, and is of particular interest for LLC circuits which implement power factor correction. Some examples relate to self-oscillating circuits and others relate to converter circuits with frequency control driven by an oscillator.

A first aspect relates to the use of an LLC resonant converter circuit as a AC/DC converter, and thus functioning as a front end PFC circuit.

The front end PFC application of an LLC converter poses several problems for the feedback control of the inverter switch arrangement, which cannot be mastered by the conventional frequency control approach. This mainly has to do with the high gain ratio requirements. The gain ratio is the ratio between the maximum and the minimum gain.

Figure 3:
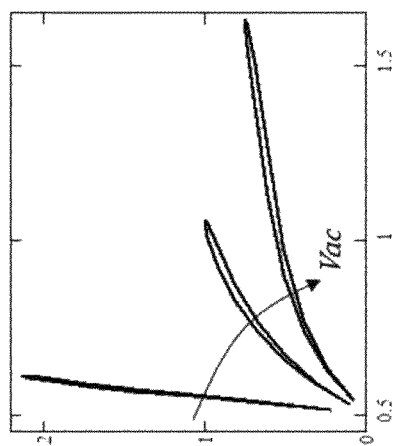
FIG. 3 shows the mains current versus the normalized switching frequency for different input AC voltage levels.
Figure 2:
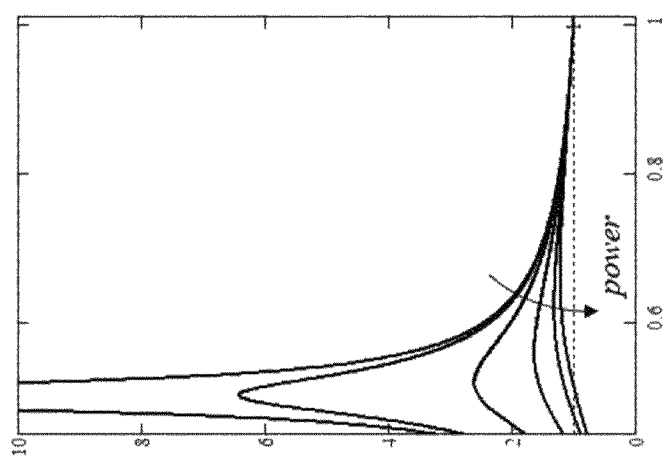
FIG. 2 shows the voltage gain with respect to the normalized switching frequency for different powers.

FIG. 2 shows the voltage gain versus the normalized switching frequency for different output powers and FIG. 3 shows the mains input current versus the normalized switching frequency for different input AC voltage levels.

Problems which arise are:

(i) The extremely high variation of the input current vs. frequency gain, d(im)/d(fs), which can vary over two to three orders of magnitude, compared to the typically less than one order of magnitude gain variation that the LLC control has to cover in case of an LED driver output stage, when controlling the output current. FIG. 2 shows the mains input current versus the switching frequency for unity power factor operation. This plot would correspond to the LLC transfer function if the switching frequency was the manipulating variable. This transfer function varies over a too wide range for using the frequency as the control variable. The gain range further increases if the AC/DC stage has to cover the 'Intellivolt' mains range (108V<V(AC)<305V).

(ii) Setting a minimum frequency in the conventional manner is not possible, which usually sets a maximum power, because unlike the conventional set-up, the minimum frequency does not correspond to the maximum but to the minimum load, as shown in FIG. 3.

(iii) These issues also render impractical the capacitive mode protection that typically comes with LLC frequency control and which requires the setting of a minimum current prior to the switching event, and where the highest load is expected at the lowest frequency.

Figure 4:
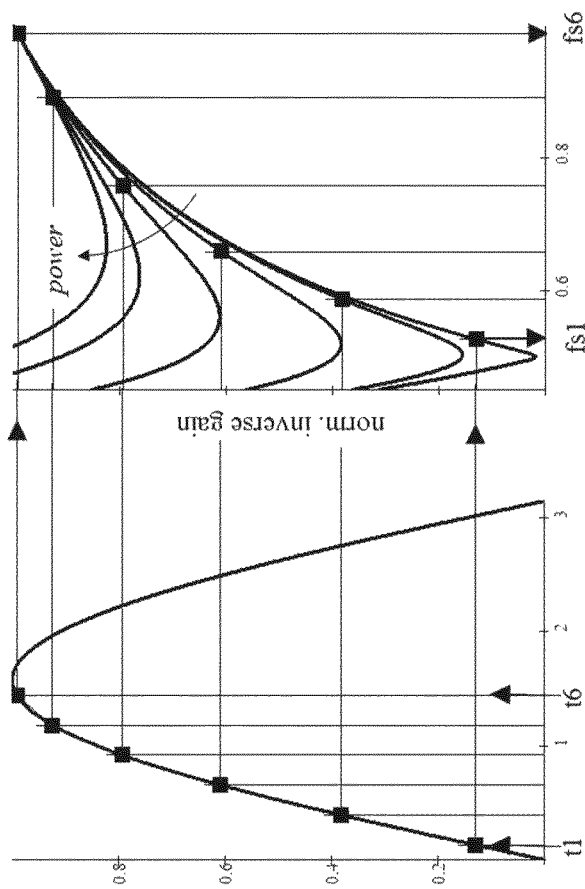
FIG. 4 shows the general task of a power factor correction required by an LLC converter.

FIG. 4 shows the general task of a power factor correction function required by the LLC converter. The left image shows the normalized mains voltage versus the phase angle, and the right image shows the normalized inverse gain versus the switching frequency.

At a low mains signal (at phase angle t1) a high gain is required (i.e., a low inverse gain (Vmains/Vo) as depicted in right image. The load however is low since for unity power factor, the load is proportional to the square of the input voltage. As a result, the LLC converter is running a light load with an extremely high gain and thus at its minimum switching frequency (fs1).

When approaching a high mains signal (at phase angle t6) the LLC converter operates at peak load. At this load it is only able to cover a small gain range around the low end of the range. Therefore, the LLC is running at its highest switching frequency (fs6).

Figure 5:
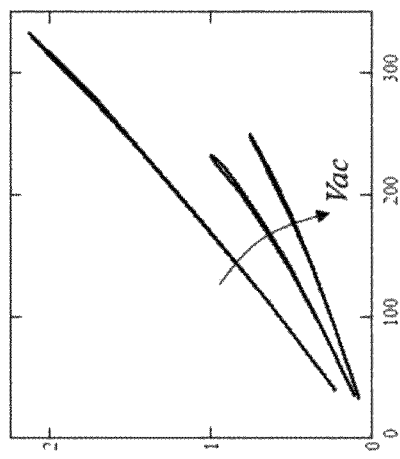
FIG. 5 shows how the gain ratio problem can be relaxed if instead of the switching frequency a threshold for an LLC state variable is used.

FIG. 5 shows how the gain ratio problem can be relaxed if instead of the switching frequency a threshold for an LLC state variable is used as the manipulating variable for controlling the input current. FIG. 5 shows the mains current versus a threshold switching voltage for three mains AC input voltages (108V, 230V, 305V).

The threshold voltage in this case is the capacitor voltage vC across the capacitor of the LLC tank. Alternatively, the transformer voltage, or the transformer input current can also be used.

Figure 6:
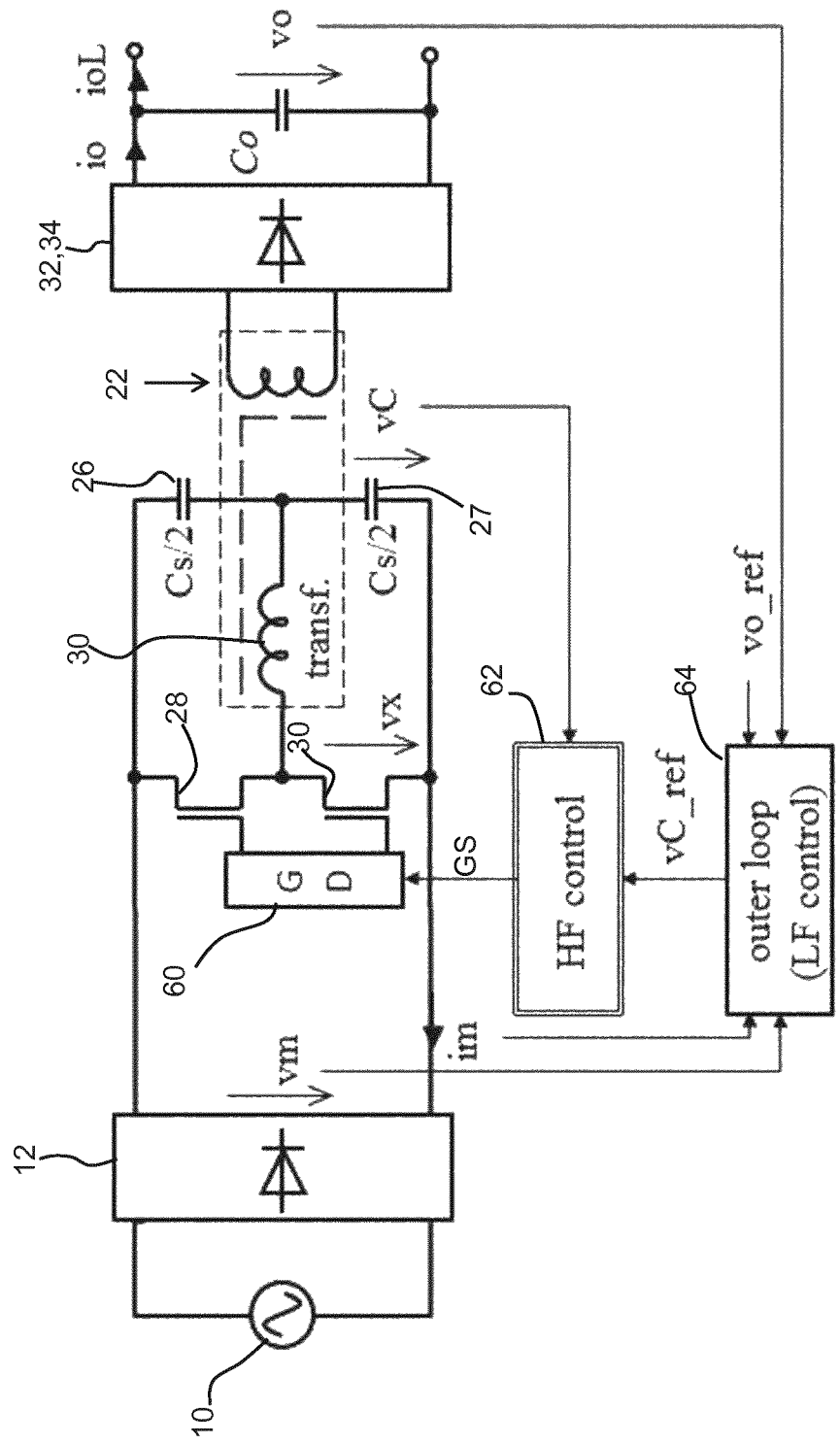
FIG. 6 shows an example of AC/DC LLC converter circuit.

FIG. 6 shows the AC/DC LLC converter circuit.

Figure 1:
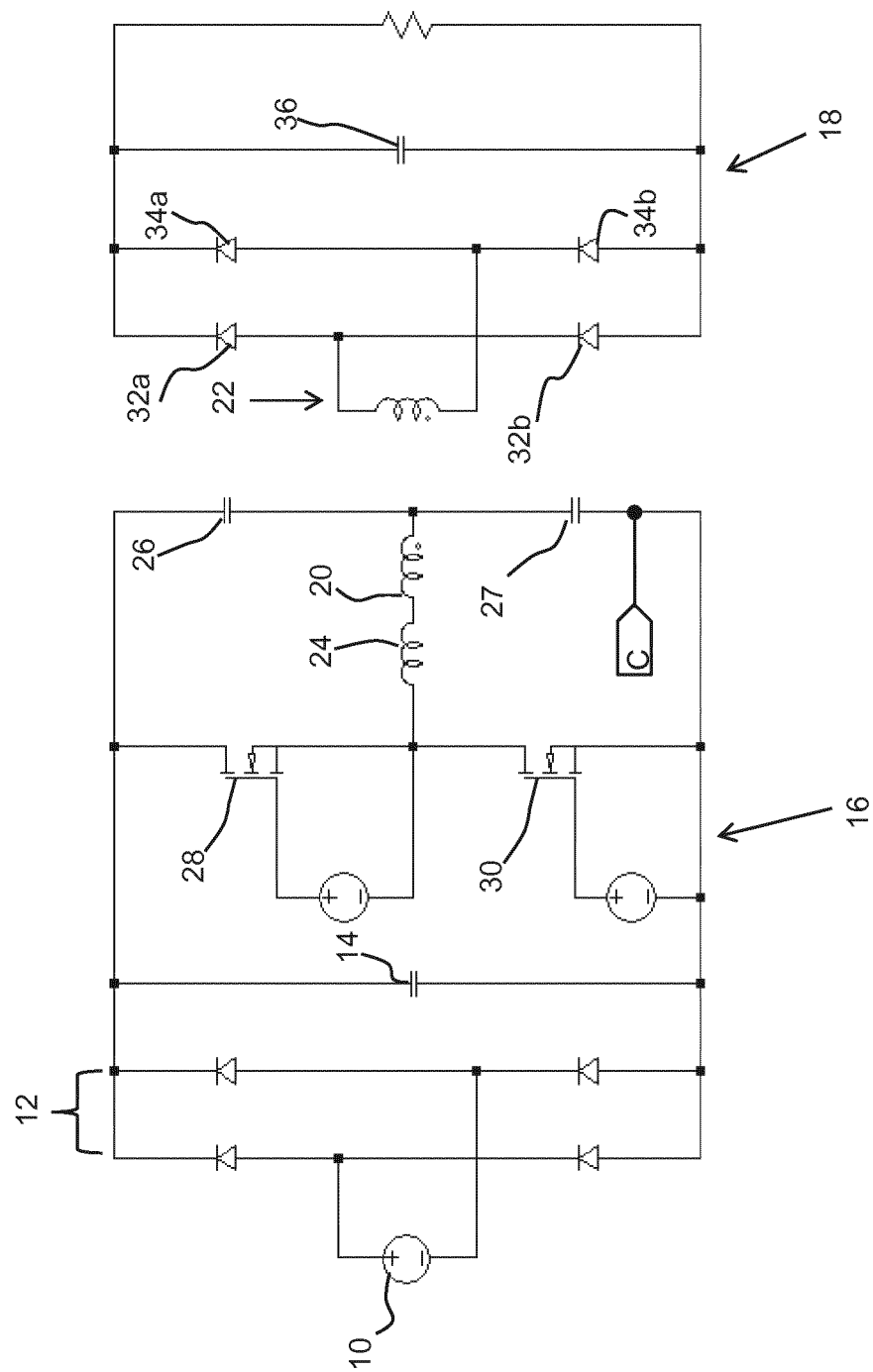
FIG. 1 shows an example of a resonant AC/DC converter which forms a PFC stage.

As in FIG. 1, the circuit has an AC mains input 10 followed by a rectifier 12. The switches 28, 30 of the half bridge inverter are controlled by a gate driver 60 which is controlled by a controller 62. The controller outputs a gate drive signal GS.

The controller is provided with a threshold value which in this example is the threshold (or reference) capacitor voltage vC_ref. The controller 62 receives the measured quantity i.e., the actual resonant capacitor voltage vC, and processes the switching voltage for the gate driver 60 that in turn controls the inverter 28, 30 and the switch node voltage vx, i.e. the voltage at the output of the half bridge inverter.

The controller is thus a control circuit having an outer control loop 64 for setting a threshold level for the electrical feedback parameter (the capacitor voltage) in dependence on the output voltage vo in this example and the input voltage and current vm, im, and an inner control loop 62 for comparing the electrical feedback parameter with the threshold to derive the gate drive signal.

The outer control loop 64 implements output control as well as implementing PFC, and the inner control loop 62 derives the switching control signal.

FIG. 7 shows the controller 62 in more detail. The measured capacitor voltage vC is compared with the reference vC_ref by comparator 70, and the comparison result is used to reset a flip flop 72 which generates the output for the gate driver 60. A delay element 74 provides a delayed set pulse so that the reset operation has a fixed duration (which is a function of the clocking speed of the flip flop).

This feedback system comprises a high frequency control loop implemented by the inner control loop 62.

The outer low frequency controller 64 receives the mains voltage vm, the actual mains current im and output voltage vo and its set point vo_ref and processes, in accordance with the power factor needs, the manipulating value of vC_ref for the switching unit.

In this example, there is only one threshold value (vC_ref) that is compared to a state variable (here vC). If the state variable exceeds the threshold, the flip-flop 72 in the controller 62 is reset and the inverter is switched off via the gate driver, i.e., the switch node voltage is set to its minimum value.

The inverter is switched on again a certain time after the switch off event. This time adapted to result in a symmetric operation i.e., at a duty cycle of the switch node of 0.5.

The capacitor voltage is one example of state variable which is used as a control input for the control of the inverter switching. An alternative state variable is the transformer voltage. The scheme is similar but signs have to be changed. For example, if a threshold is exceeded the flip flop 72 in the controller 62 has to be switched on.

In another scheme, there are two thresholds. The inverter is switched off (on) once the state variable exceeds a first upper threshold and the inverter is switched on (off) if the state variable passes a second threshold. Here, the second threshold is a function of the first threshold and the input voltage.

In this way, the control circuit is adapted to set a first threshold of the electrical feedback parameter for turning on the gate drive signal and a second threshold of the electrical feedback parameter for turning off the gate drive signal.

These thresholds are shown in FIG. 20 and discussed further below. One threshold is between the mid-value of the signal vC and the peak value and the other is between the mid-value of the signal vC and the valley value.

The two threshold values are symmetric with respect to the average value of the signal (vC in this example). The first (upper) threshold is a certain value above the average, and the second (lower) threshold is the same value below the average.

Thus, in one implementation, there is only one threshold. In another implementation, the inverter is switched off (on) once the state variable exceeds a first upper threshold and the inverter is switched on (off) when the state variable passes a second threshold. The outer control loop can either control the output voltage or the output current with respect to a given set point. For example, for a PFC pre-regulator, the output voltage will be controlled whereas for a single stage driver the output current may be controlled.

Instead of using a transformer as isolation means as shown in FIG. 6, isolating capacitors may be used as well. For example, by using an extra isolating (e.g. DC blocking) capacitor between the inverter switch node and the transformer, and another between the other primary side winding terminal and the midpoint of the resonant capacitors.

Alternatively, in order to save components, the resonant capacitors can also be designed for isolating from the mains voltage (y-capacitors). Here the above mentioned state variable (vC) cannot be accessed directly any longer but can be derived by measuring and integrating the current into the isolating capacitors.

In any of these configurations, the transformer need not to be isolating and can be simplified, depending on the end use of the circuit.

A second aspect relates to a Von-Ton (or Voff-Toff) drive scheme. As explained above, after a switching event, the switching state is retained for a pre-determined time duration.

This aspect provides a single threshold together with control based on the duty cycle itself. In this way, the complexity and sensitivity to threshold variations is reduced.

The duty cycle may be controlled to a defined value that may change dynamically during converter operation.

For certain types of threshold-based switching scheme, the Von-Voff control has previously been used (as described above as case A). In such a case, two symmetric thresholds are defined for determining the on and off transitions of the half-bridge. However, the duty cycle is extremely sensitive to the exact positioning of the two thresholds. Moreover, even small deviations from 50% of only 1% or 2% can result in strong asymmetries in the output current of 25% or more.

This aspect is based on integrating a constant value while the controller is waiting for the voltage threshold to be achieved, and then to integrate another constant (with the opposite sign) in order to define the on or off time.

In a first embodiment, a controller defines the on-transition of the half-bridge in a Voff-Toff control scheme as described above as case C. This is performed via the circuit shown in FIG. 8.

The circuit comprises an integrator comprising amplifier IC 80 having an amplifier 81 used by the circuit, an integrating capacitor 82 (C19) in a negative feedback loop of the amplifier 81, and an input resistor 84 (R25). The gate driver signal GS is received as input. A buffer IC 86 is at the output, and each IC has decoupling capacitors 88, 90 (C20, C22).

In order to ensure a 50% duty cycle, the non-inverting input of the amplifier 81 is connected to one-half of the peak value of GS. This is performed via a peak-detector comprising diode 92 (D16), and capacitor 96 (C18), followed by a voltage divider 98 comprised of two resistors 100 (R26) and 102 (R27). Resistor 100 (R26) is slightly smaller than resistor 102 in order to account of the voltage drop across the diode 92.

There is also a current limiting resistor 94 (R24) in series with the diode 92 as part of the peak detector, which may be eliminated depending on the peak current handling capability of the other components in the circuit.

At the output of the integrator, a MOSFET 102 couples the output to ground. The transistor 102 is controlled by the gate driver signal GS, via a gate resistor 104 (R29).

When GS is high, the drain of MOSFET 102 is pulled down, and consequently the output symout is held at a high level (as a result of the inverting buffer 86). When GS transitions to low, this blanking is removed, and an output capacitor 106 (C21) at the output of the integrator begins to charge via a charging resistor 108 (R28). This voltage is then divided down by a divider circuit 110 (of two resistors 112 (R30) and 114 (R31)), in order to achieve a suitable input voltage range for the inverter 86. This voltage divider may not be necessary depending on the voltage range expected on the output of the integrator.

When the capacitor 106 is sufficiently charged, this triggers the inverting buffer 86 and then the output symout becomes low.

The other components are bias elements.

Figure 9:
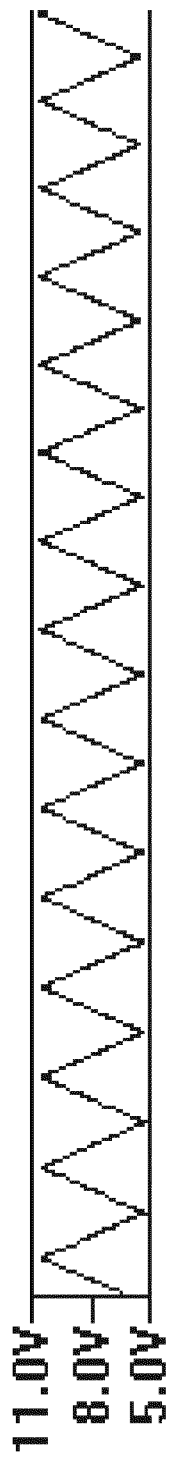
FIG. 9 shows the output of the integrator in FIG. 8.

The output of the integrator 80, 82, 84 is depicted in FIG. 9.

The GS signal reflects the on or off state of the half-bridge. When the GS signal is high, the half-bridge is on, the high side switch is on, the integrator input is high, and the integrator output is decreasing linearly (because of the inverting nature). When the GS signal is low, the half-bridge is off, and the integrator output is increasing linearly.

In this way, a first constant value is integrated until the electrical feedback parameter reaches a threshold value, and a first time duration during which the integration takes place defines the duration of the GS high signal (which may be an on-time or an off-time of the high side switch or the low side switch). A second constant value of opposite sign to the first constant value is integrated to define a second time duration for setting the subsequent off-time or on-time, respectively. This then determines the duration of the GS low signal.

The output signal ("symout") is usually high, and in this embodiment, the indication that the appropriate time interval has elapsed is provided by a short, low pulse on the symout node.

In this example of implementation, this symout pulse than signals the end of the GS low signal. The signal "symout" is the set signal for the flip flop 72 which sets the flip flop high, and the threshold crossing resets the flip flop to low.

Thus, the duration of the GS high signal is controlled by threshold control, and the duration of the subsequent GS low signal is internally calculated to correspond (if a 50% duty cycle is desired).

Asymmetric duty cycles may also be implemented by changing the voltage-division factor of the voltage divider 98 with an additional pull-up or pull-down resistor attached to the non-inverting input of the amplifier 81.

For proper operation, it is important to ensure that the output of the amplifier 81 does not hit its rails for the designed frequency range that the control should work within. If the frequency is too low, the lower rail will be hit, and if the frequency is too high, the upper rail will be hit.

Figure 10:
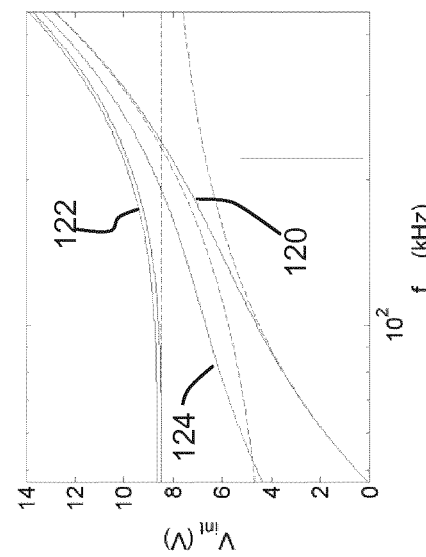
FIG. 10 shows the operating range for the circuit of FIG. 8 for a certain set of parameter values.

The operating range is depicted in FIG. 10 for a certain set of parameter values.

It shows the output of the gate-symmetry integrator as a function of frequency. The solid black curves are for the valley (plot 120), peak (plot 122) and average (plot 124) of the triangular waveform. Plot 122 also corresponds to the effect of delay in the switch-off action. The dashed lines show various asymptotes to the plots 120 and 122.

At low frequency, the peak of the triangular waveform shown in FIG. 9 saturates at:

$$V_{int,pk,LF} = \frac{V_{ref} \cdot R28 \cdot C21 \cdot (R30 + R31)}{R25 \cdot C19 \cdot (R30 + R31 + R28)} + V_t \cdot \frac{R30 + R31 + R28}{R31}$$

where Vref is the voltage on the non-inverting input of the amplifier 81, and Vt is the threshold voltage that triggers a high-to-low transition on the output of the inverter 86. Typically, the term involving the threshold voltage dominates this expression.

Note that this expression includes the loading effect of the voltage divider 110 (due to R30 and R31). Simpler expressions result if this divider is not present; however, due to the different supply voltages for the amplifier and inverter, this divider may be necessary. The voltage divider resistors are chosen such that a voltage across the output capacitor 106 that is slightly less than half of the opamp supply will trigger the inverter.

The time constants associated with resistor 84 (R25) and inverting capacitor 82 (C19) and with the output filter 108 (R28) and 106 (C21) are then chosen to give the proper bandwidth for the control. Resistor 84 and capacitor 82 primarily affect the low-frequency cutoff (where the lower rail of the amplifier is encountered), and resistor 108 and capacitor 106 primarily affect the high-frequency cutoff (where the high rail of the amplifier is encountered).

The low-frequency cutoff may be approximately computed by solving the equation for the low-frequency asymptote to the plot 120 shown in FIG. 10. Explicitly, this is:

$$V_{ref}\left(\frac{R28 \cdot C21 \cdot (R30+R31)}{R25 \cdot C21 \cdot (R30+R30+R28)} - \frac{t_{off}}{R25 \cdot C21}\right) + V_t \cdot \frac{R30+R31+R28}{R31} = 0$$

where $t_{off}=(1-D)/f_{sw}$, D is the desired duty cycle of 0.5 in this case, and $f_{SW}$ is a lower bound on the switching frequency. The high-frequency cutoff may be approximately computed by solving the equation for the high-frequency asymptote or by simply plotting the analytic expression for the peak voltage of the triangular waveform shown in FIG. 9.

If using the asymptote, it is advisable to leave significant headroom as the accuracy of this expression is limited; nevertheless, it is often still sufficient. The asymptotic equation to solve is:

$$V_{ref} \cdot \frac{t_{off}}{R25 \cdot C21} + V_t\left(\frac{R30+R31+R28}{2 \cdot R31} + \frac{R28 \cdot C21 \cdot (R30+R31)}{t_{off} \cdot R31}\right) = V_{P14V}$$

Other embodiments to this aspect will be apparent to those skilled in the art. For example, symmetry control may be applied to the high or to the low side switch (or to provide a control signal for full-bridge switching), Duty cycles other than 50% may be derived by simple changes to the voltage dividers (98 or 142). There may be other means of deriving the reference signal applied to the non-inverting input of the opamp apart from the peak detector or voltage divider described above.

The reference signal for the symmetry may also be derived from other waveforms in the circuit (other than the GS signal or the switch node voltage); for example, from the output current, i.e., by comparing the average current through the rectifier diode arrangements 32 and 34, or by assessing the resonant capacitor voltage in terms of comparing its positive and negative peak to the average value.

A third aspect is directed to the problem that when using threshold detection in a resonant converter, however, the relevant state variable(s) (such as the capacitor voltage used in the example above) may continue to rise (or fall) above (or below) the relevant threshold for some time after the threshold has been reached.

This aspect relates to an approach by which the relevant state variable may be "blanked" for some time after the detected threshold crossing in order to avoid unwanted, false triggering in the detection circuitry.

In order to show this problem, control scheme C (Voff-Toff) is considered where the voltage-threshold is based upon the resonant capacitor voltage, i.e., the voltage across capacitor 26 in FIG. 1 (labeled as node C).

Figure 11:
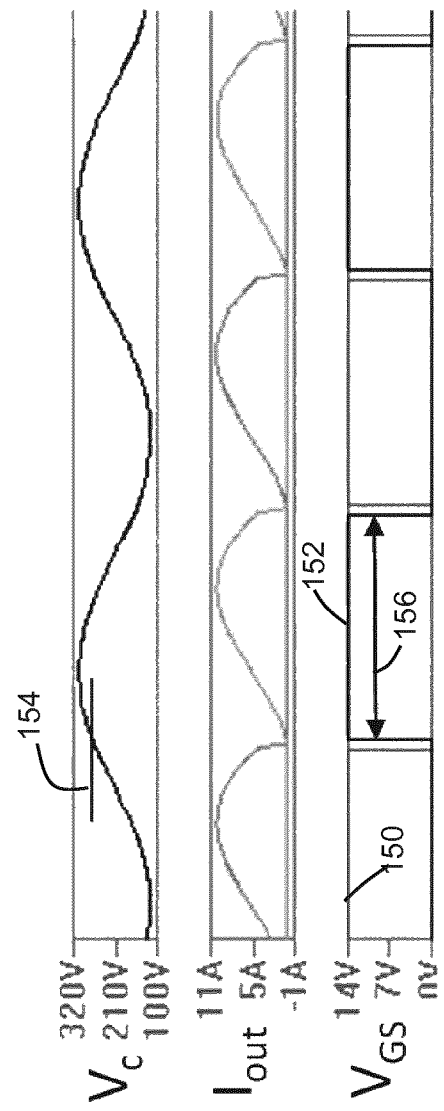
FIG. 11 shows waveforms to show unwanted, false triggering in the detection circuitry.

Some example waveforms are shown in FIG. 11, in particular the resonant capacitor voltage $V_C$, the output current $I_{OUT}$ through the diode arrangements 32 and 34 in FIG. 1 and the gate drive signals for the high side transistor (plot 150) and for the low side transistor (plot 152).

The line 154 in the top plot indicates the voltage threshold, and the arrow 156 in the bottom plot indicates the time-based threshold.

As may be seen in the top plot, the resonant capacitor voltage continues to increase for some time after the capacitor threshold voltage, and this issue is addressed in this aspect.

The issue arises in cases where the off-time is sufficiently short such that the on-transition of the half-bridge occurs while the resonant capacitor voltage is still above the threshold. This will lead to an immediate triggering of the off-transition, and is undesired.

Referring to FIG. 11, a method is used whereby the sensed resonant capacitor voltage Vc is "blanked" such that the voltage is only detected when the half-bridge is in the appropriate state, and when the slope of the detected voltage has the correct sign (in this case, the slope should be positive). This method also applies to blanking other sensed state variables such as the voltage across the transformer, for example.

Figure 12:
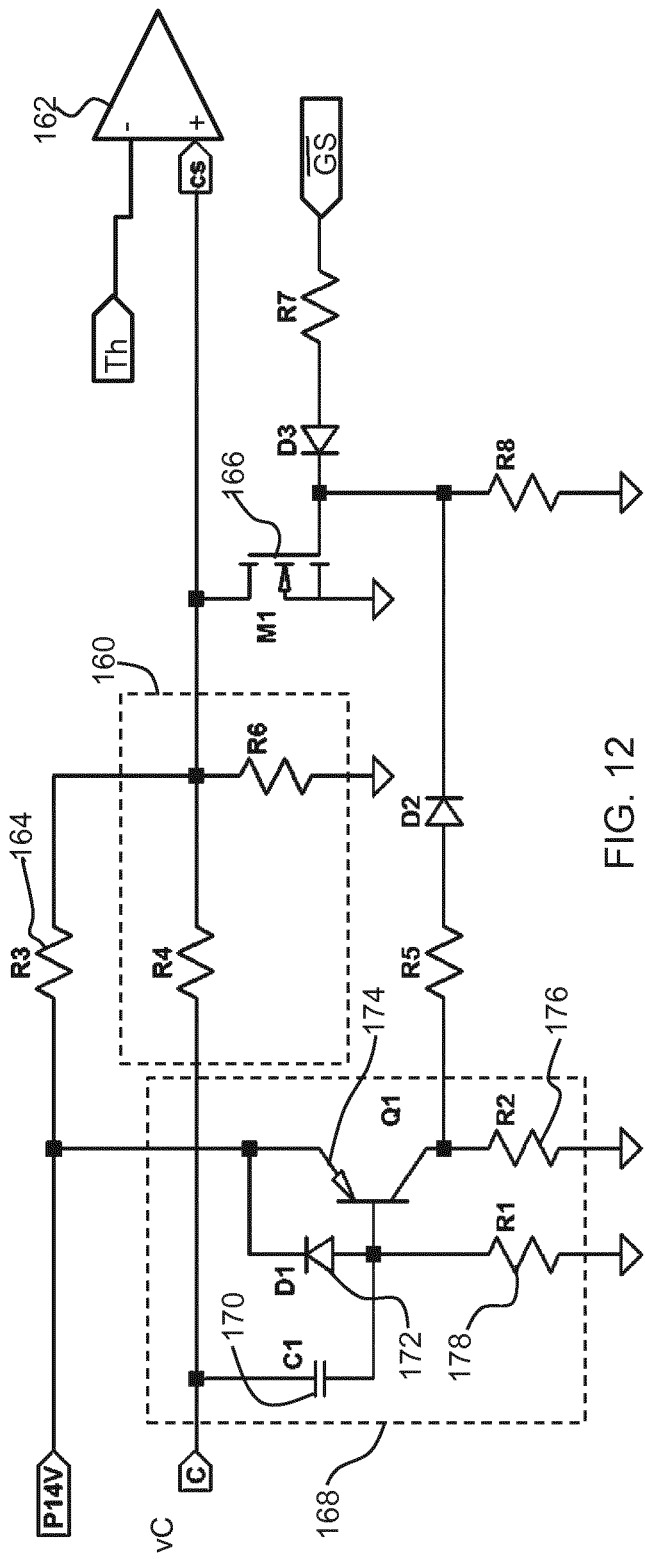
FIG. 12 shows a circuit with a blanking function to address the problem of false triggering.

One example is depicted in FIG. 12 for the case of a sensed resonant capacitor voltage Vc (at node C) in the Voff-Toff control scheme. P14V is a local supply voltage which is used to power the control circuitry. This local supply is typically in the 3-25V range.

The resonant capacitor voltage is input to the circuitry at node "C". Since this voltage can be rather high in a resonant converter (hundreds or even thousands of volts), this voltage is divided down by voltage divider 160 (R4 and R6) such that the desired threshold voltage corresponds to a reasonable voltage level detected on the "cs" node. This node is the positive input of a comparator 162 with its negative input fed by the set point "Th" for the threshold. Thus, it is the processed voltage vC which is used for comparison with the threshold voltage. By blanking the voltage at node cs, the threshold comparison proceeds as if vC at the blanking voltage.

When the comparator 162 detects that the threshold has been crossed, it resets the flip flop controlling the half-bridge (for example as shown in FIG. 7).

If desired, a small offset may be added to this signal via resistor 164 (R3).

A MOSFET transistor 166 (M1) activates blanking of the "cs" voltage by shorting this node to ground when blanking is activated. In particular, blanking is activated when the half-bridge, in the Voff-Toff control scheme, is already in the off-state (the signal on "GS" is low i.e. NOT(GS) is high), which is the low side transistor gate voltage) or when the slope of the resonant capacitor voltage with respect to time is negative.

In this embodiment, an "or" function is implemented via diode-logic involving diodes D2, D3 and the pull-down resistor R8.

R5 and R7 are simply used for current limiting through the diodes and may be omitted if the circuitry can handle the resultant current.

The slope detection in this circuit is implemented via a slop detection circuit 168. When the slope is positive, there is a current through a capacitor 170 (C1) and diode 172 (D1), and the transistor 174 is in the off-state. A pull down resistor 176 (R2) pulls down the anode of the diode D2, and then the blanking is determined by the state of the half-bridge alone (via "GS").

If the slope is negative, the current through the capacitor 170 will bias the transistor 174 in the on-state, and pull the anode of diode D2 high, which will, in turn, turn on the transistor 166 and pull the node "cs" low.

Figure 13:
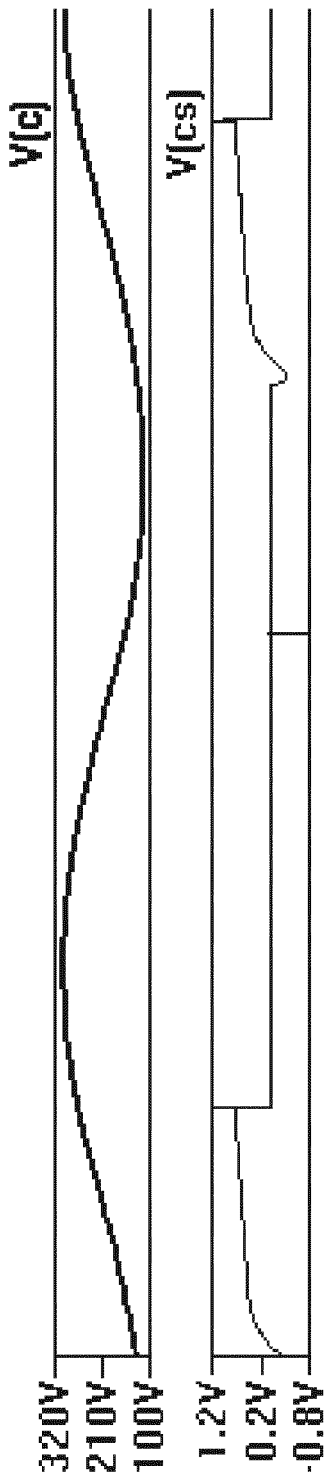
FIG. 13 shows the circuit operation for the circuit of FIG. 12.

The circuit operation may be seen in FIG. 13. The top plot shows the resonant capacitor voltage, i.e. Vc and the bottom plot shows the signal on node "cs".

When the half-bridge is in the off-state, the "cs" signal is blanked. It is also evident that the resonant capacitor voltage vC continues to rise for some time after the switching action occurs. In addition, the blanking is not removed until the slope of the resonant capacitor voltage becomes sufficiently positive.

In this way, the signal cs only tracks the actual voltage vC when vC is approaching the threshold level and from the correct side. For an upper threshold, the voltage vC is increasing towards the threshold. For a lower threshold, the voltage vC is decreasing towards the threshold. Either approach is possible, even though only the example of an upper threshold is given. Because the upper threshold is for turning off the high side switch, it is only need when the high side switch is on.

Due to delays in the circuitry, the slope detection circuitry (via 170 and 174) may result in blanking occurring just a little bit later than really desired (as may be seen in FIG. 13). For this reason, a resistor 178 (R1) may also be added in order to shift the threshold for the "zero" slope detection to a new value of (VP14V±Vdio)/R1, where Vdio is the forward diode drop in diode 172 (which is assumed to be equal to the drop across the base-emitter junction of transistor 174), and the plus or minus signs correspond to the low-to-high and high-to-low transitions in the voltage across resistor 176. Resistor 178 causes the voltage across resistor 176 to make the low-to-high transition a bit early, and the high-to-low transition a bit late. Only the former transition is of key importance for this circuit.

This approach thus makes use of a detecting circuit 168 for detecting a slope of the electrical feedback parameter and a circuit 166 for disabling the electrical feedback parameter vC in dependence on the slope of the electrical feedback parameter and the level of the gate drive signal GS.

Other embodiments may be similarly derived using other types of logic gates in order to implement the equivalent of this "or" function.

Figure 14:
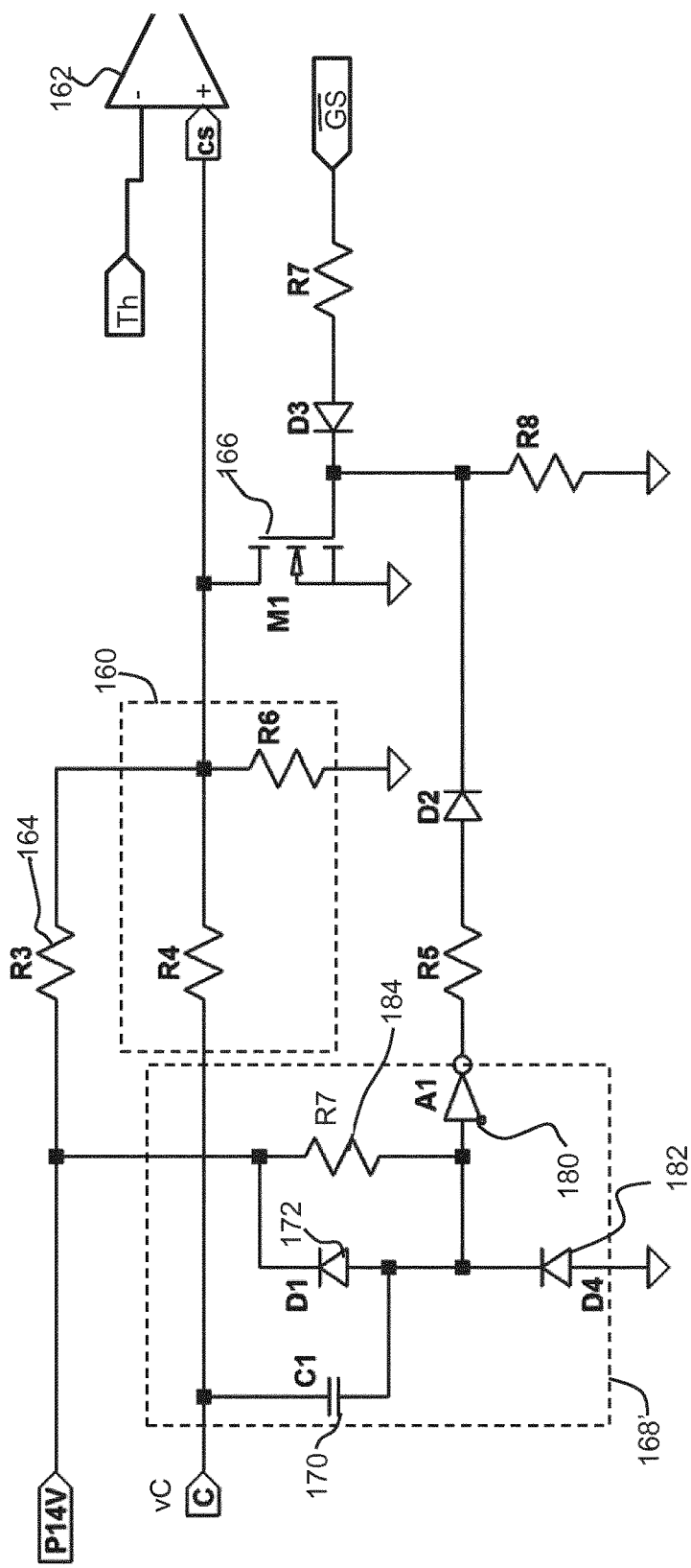
FIG. 14 shows an alternative embodiment to the circuit of FIG. 12 which uses a buffer.

An alternative embodiment uses a buffer in order to derive the slope-detection signal as shown in FIG. 14.

The same components are given the same references as in FIG. 12. A different slope detection circuit 168' is shown.

With a positive slope on node "C" at voltage vC, the current conducts through capacitor 170 and diode 172 as in the circuit of FIG. 12. This pulls the input of an inverter 180 (A1) high. This makes the output of the inverter 180 low, and then the blanking is determined by the state of the half-bridge alone (via "GS").

With a negative slope, the current conducts through capacitor 170 and a diode 182 (D4), pulling the input of inverter 180 low, and the output high. This results in transistor 166 turning on, and the node "cs" is pulled low. In this case, a resistor 184 (R7) is used to pull up the inverter input in the event of no or low current as the default condition.

Other embodiments are also possible by considering similar variations corresponding to the Von-Voff and Von-Ton control schemes, variations in the slope detection circuitry, variations in the logic function to drive the gate of transistor 166, variations in the use of NMOS or PMOS MOSFETs, variations in the use of PNP or NPN bipolar transistors, and so on.

A fourth aspect relates to rendering a high power factor of a resonant PFC LLC circuit without sensing and feeding back the mains input current. It is of particular interest for use of the circuit as a pre-regulating front end, although it can again be employed in a single stage driver.

Mains input current sensing is associated with extra circuit effort and thus with extra costs and PCB area. Typically a shunt resistor is used for the current measurement which results in power losses.

Unlike a boost converter (or other buck-derived converters) a resonant LLC converter does not offer an operation like the constant on-time mode to achieve an acceptable power factor without employing a mains current measurement.

Therefore, a control scheme for the LLC power factor pre-regulator is desired that does not require measuring the input current and still enables a power factor that satisfies e.g. the mains harmonic regulations of EN 61000-3-2.

The required behavior of a front end power stage, namely to render a (virtually) resistive input impedance i.e., an operation scheme that results in the mains input current being proportional to the mains input voltage, is achieved in this aspect by controlling, in place of the actual mains input current (i_mains), the voltage of the resonant capacitor at the inverter switching instant (vC_off and/or vC_on) to be proportional to the (rectified) mains input voltage (vm).

When an LLC circuit operates at widely varying input voltages, e.g. at the rectified mains voltage, the converter (if designed correspondingly) shows an input current that is essentially proportional to the resonant capacitor voltage at the inverter switching instants vC_off or vC_on.

Thus, instead of explicitly controlling (and therefore measuring) the mains current, the voltage vC_off (or vC_on) is controlled (and measured) instead. The advantage is that a voltage measurement takes less circuit effort and is virtually loss-less.

Non-ideal components of the input current waveform can be further compensated, to approach a unity power factor over a wide input voltage and load range.

Figure 15:
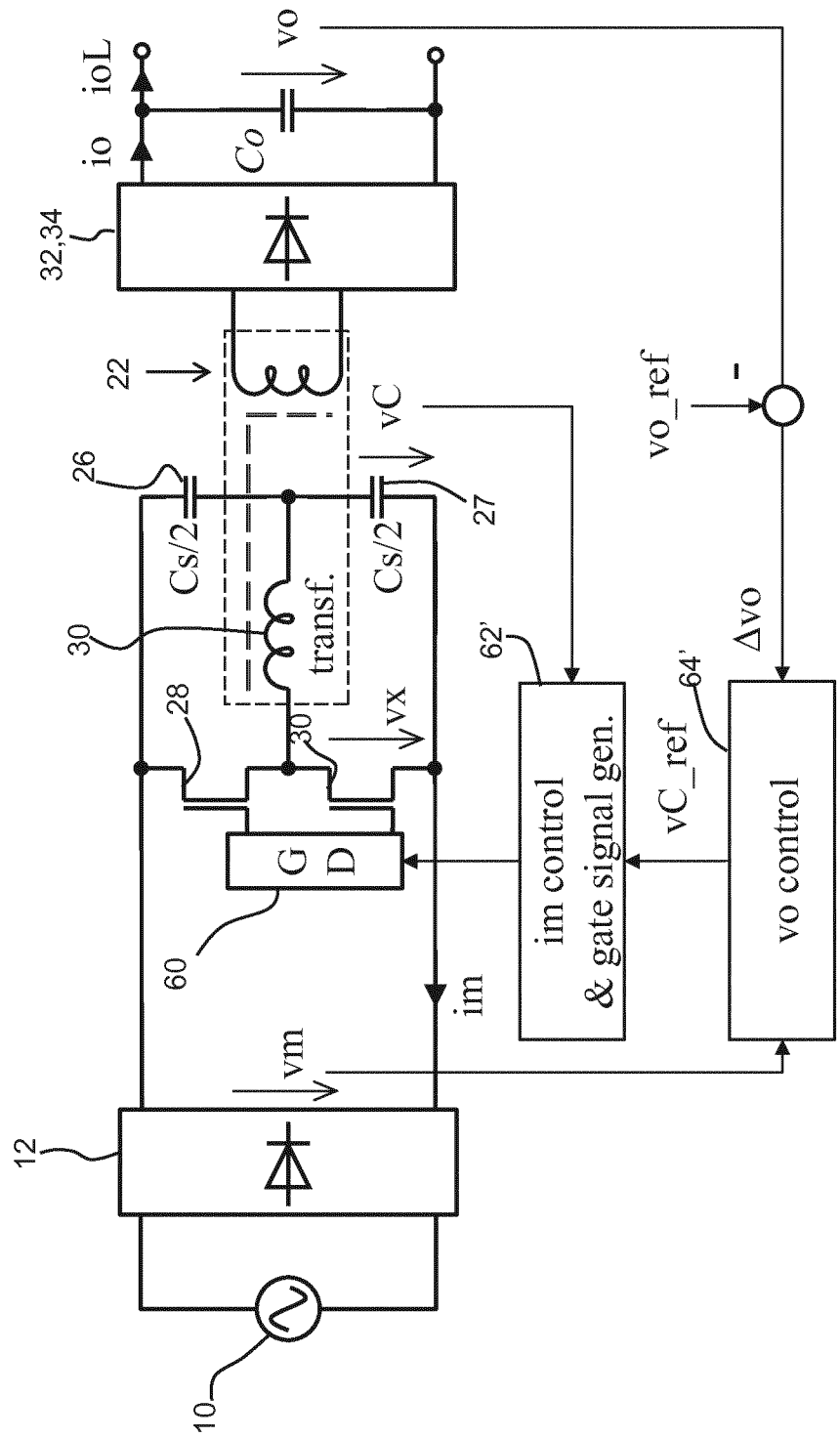
FIG. 15 shows an LLC power converter connected to the rectified mains, and designed to deliver a high power factor without measurement of the input current.

FIG. 15 shows the LLC power converter connected to the rectified mans, and designed to deliver a high power factor. Unlike in the examples described above, the mains current (im) is no longer measured and fed back.

FIG. 15 corresponds to FIG. 6, and the same reference numbers are used. Compared to FIG. 6, there is a different high frequency inner control loop 62' and a different output control loop 64'.

The outer control loop 64' again processes a difference between a desired output voltage vo_ref and a measured output voltage vo, but it does not receive a measure of the input current.

Only the output voltage (or current) is controlled explicitly in the outer control loop 64', whereas in the inner control the mains current (im) is implicitly controlled, i.e. by controlling the capacitor switching voltage vC_off (or vC_on) to follow the reference vC_ref that is generated by the outer control loop 64' and that is proportional to the rectified mains voltage (vm) and to the control error ($\Delta$vo).

Figure 16:
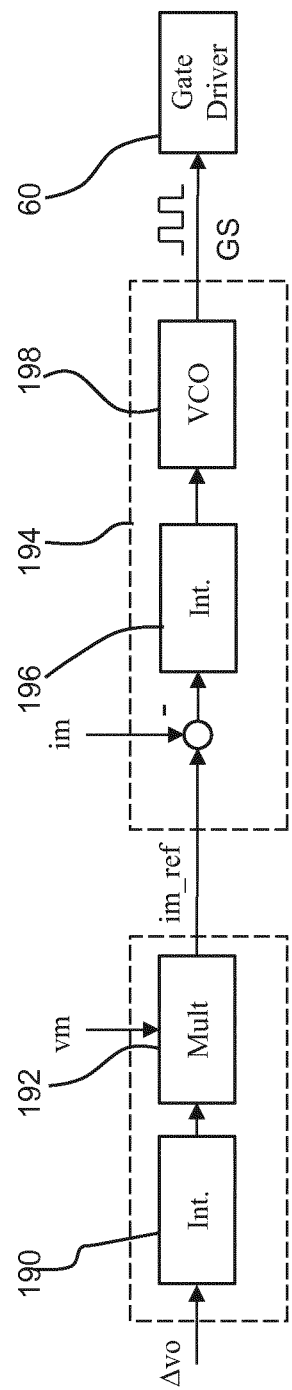
FIG. 16 shows the structure of a first PFC control that uses the LLC converter of FIG. 18 in a first known manner, namely using the frequency as the manipulating variable and feeding back the mains current;.

FIG. 16 shows the structure of a first PFC control that uses the LLC converter in a known manner, namely using the frequency as the manipulating variable and feeding back the mains current.

The output voltage error $\Delta$vo is integrated in integrator 190 and multiplied by the prevailing rectified mains voltage vm in multiplier 192 to derive the reference mains current im_ref.

At unity power factor, the instantaneous mains current is:

$$im = vm * vm / Rac.$$

In the above relation, vm is the instantaneous mains voltage and Rac is the equivalent mains resistance that depends on the load and the mains rms value Vac (e.g. Vac=240Vrms). The mains resistance can be written as Rac=Vac*Vac/Pac.

In the above relation, Pac is the rms value of the power taken by the converter. The mains current can thus be expressed by:

im=vm*Pac/(Vac*Vac)

The integrated control error is representative for the term Pac/(Vac*Vac), which is generated by the outer control loop. The product of that term with vm represents the instantaneous reference value for the mains current (im).

In a digital implementation using e.g. a micro control unit, these parameters are represented by register values whereas voltages are most convenient in an analog PF control.

The reference mains current is provided to a frequency control unit 194 which integrates a current error using integrator 196 to provide frequency control of a voltage controlled oscillator 198.

Figure 17:
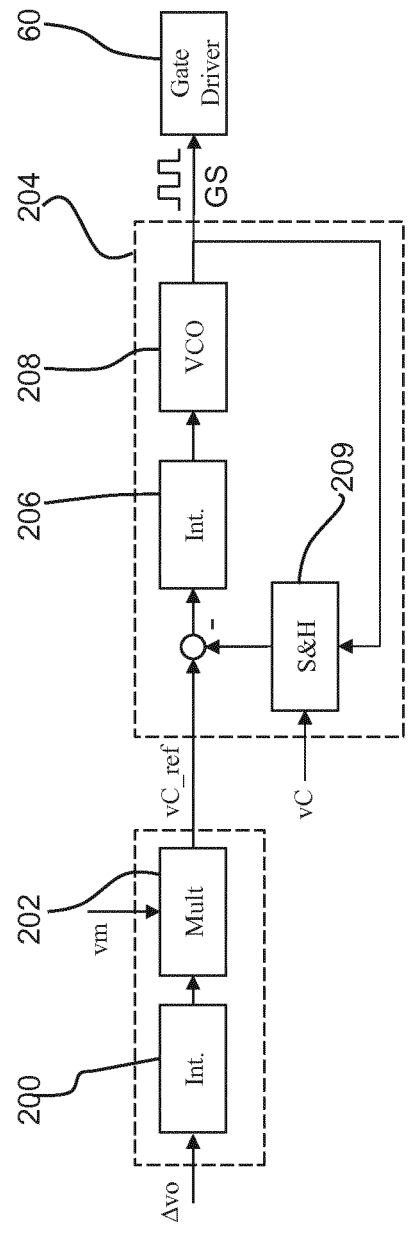
FIG. 17 shows an approach which uses frequency control but controls the resonant capacitor switching voltage to be proportional to the mains voltage.

FIG. 17 shows an approach relating to this aspect which also uses frequency control but controls the resonant capacitor switching (or threshold) voltage to be proportional to the mains voltage (vm). This approach also implements an average threshold control, as explained below in a fifth aspect.

The output voltage error Δvo is integrated in integrator 200 and multiplied by the current mains voltage vm in multiplier 192 202 to derive a reference capacitor voltage vC_ref. Thus, the feedback system uses the capacitor voltage as the feedback parameter.

The reference capacitor voltage is provided to a frequency control unit 204 which integrates an error signal using integrator 206 to provide frequency control of a voltage controlled oscillator 208. The error signal is representative, but not a measure of, a current error. The feedback loop comprises a sample and hold unit 209 for sampling the capacitor voltage at the switching instants. There may be one or two sampled value of vC per cycle.

This approach avoids the need for mains current measurement but still uses frequency control.

FIG. 18 shows a control implementation which also feeds back the mains input current. The control however makes use of the self-oscillating switching approach described above, in which the parameter which determines the control is the capacitor voltage.

It can be seen that this control approach makes use of a single threshold control value. The control may thus be implemented as explained with reference to FIG. 7, and it may use the timing approach explained with reference to FIGS. 8 to 10.

The first stage 190, 192 is as in FIG. 16, and the difference current is again integrated in unit 196. However the output is a reference capacitor voltage vC_ref, which is then compared with the capacitor voltage vC by comparator 210. This then controls a set and reset flip flop (as described above with reference to FIG. 7), instead of controlling an oscillator.

In FIG. 19 an approach is shown that combines the use of the capacitor voltage as the reference signal vC_ref instead of having input current measurement. This provides an even simpler circuit.

FIG. 20 shows the capacitor voltage vC and the threshold (or switching) voltages vC_on and vC_off, i.e. the voltage vC at the inverter switching instant.

The time at which the capacitor voltage is sampled is the two switching instants of the node X, as shown in FIG. 20.

For a high power factor, the PFC circuit has to emulate a constant AC-resistance (Rac0) that only depends on the mains voltage amplitude (Vm_pk) and the load (Po) divided by the power efficiency (η) of the converter:

Rac0=Vm_pk$^2$/(2 Po/η)=const.

When operating the LLC in as described above, the actual AC-resistance can be expressed as:

Rac=1/(fs Cs (2vC_off/vm−1)),

This is a function of the switching frequency (fs), the resonant capacitor Cs, its voltage at the switching instant (vC_off) and the instantaneous rectified mains voltage (vm). The control keeps the ratio of vC_off and vm constant. For a given converter design, this ratio only depends on the load. In the course of a mains cycle, however, the frequency varies, which principally results in a non-uniform power factor and which depends on the converter design and its operation in terms of the mains voltage amplitude and the load.

FIGS. 21 to 23 show on the left the mains current waveforms of a design resulting from the control of FIG. 17 or 19 (with the control of vC) for various input voltages. FIG. 21 is for 108V(AC), FIG. 22 is for 230V(AC) and FIG. 23 is for 305V(AC).

The solid line in the left images is the mains current as resulting from the control according to the invention. The dashed line is the rectified mains current for unity power factor (i.e. a perfect, rectified sine).

The right graph in each case shows that the set point for the resonant capacitor voltage (vC_ref, y-axis) at which switching of the inverters switches is triggered is adapted to be proportional to the mains voltage (vm, x-axis).

The corresponding total harmonic distortions (THDs) are 2.5%, 10.5% and 19.3%.

A fifth aspect builds upon the approach above of FIGS. 15 to 20 (without mains current sensing), to render a higher power factor of the resonant PFC LLC. This provides a further improvement of the power factor in order to overcome the non-unity power factor resulting from the above described approach (i.e. using the resonant capacitor switching voltage in place of (or to represent) the mains current. The approach is based on compensating for the errors that depend on the instantaneous mains voltage, the peak mains voltage and on the load (Po).

Figure 24:
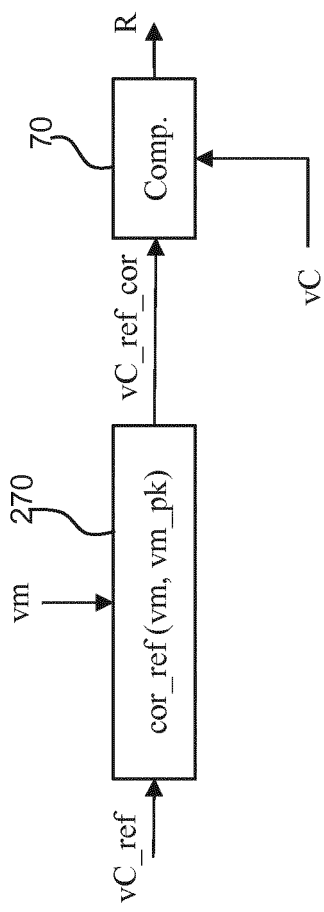
FIG. 24 shows a modification to the control scheme of FIG. 19, having a correction block.

FIG. 24 shows a modification to the control scheme of FIG. 19, in which after the reference capacitor voltage vC_ref is obtained, a correction is applied as shown by block 270 before the comparison step in block 70. The correction is thus inserted into the capacitor reference path.

Figure 25:
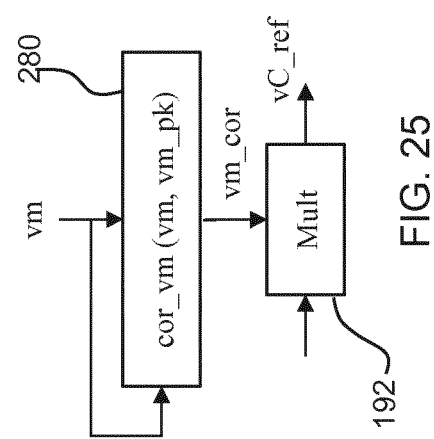
FIG. 25 shows an alternative modification to the control scheme of FIG. 17, having a correction block.

FIG. 25 shows a modification to the control scheme of FIG. 19 in which before the reference capacitor voltage vC_ref is obtained by the multiplier 192, a correction is applied to the measured mains voltage vm as shown by block 280. The correction is thus inserted into the mains voltage measurement path.

Figure 26:
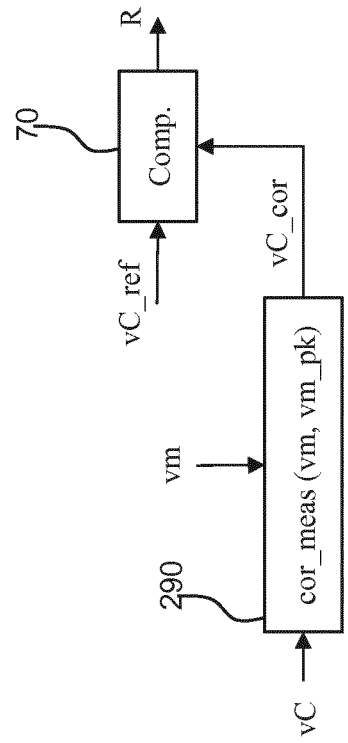
FIG. 26 shows an alternative modification to the control scheme of FIG. 19 having a correction block.

FIG. 26 shows an alternative modification to the control scheme of FIG. 19, in which the measured capacitor voltage vC is subjected to a correction in block 290, depending on the measured mains voltage vm, before the corrected capacitor voltage vC_cor is compared with the reference vC_ref in the comparator 70. The correction is thus inserted into the capacitor voltage feedback path.

Figure 27:
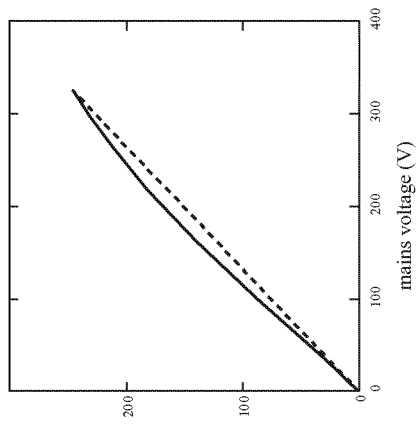
FIGS. 27 and 28 show the mains current waveforms of a design resulting from the control of FIG. 17 or 19 as modified using the correction approach together with the modifications implemented by the correction functions.
Figure 27:
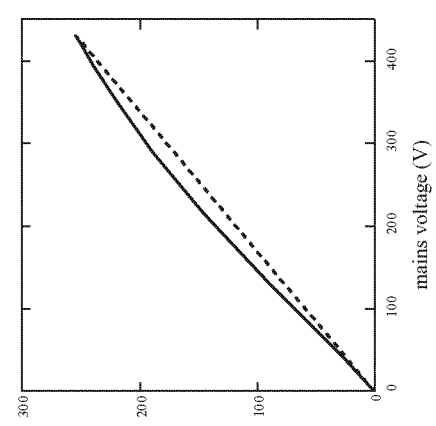
Figure 28:
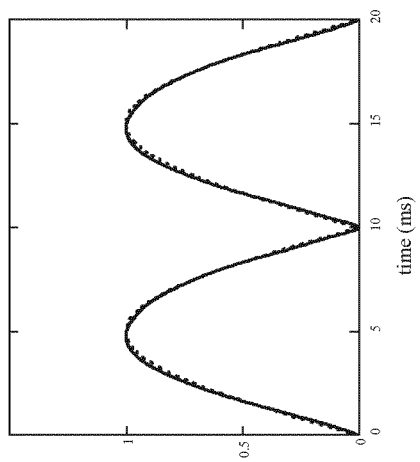
Figure 28:
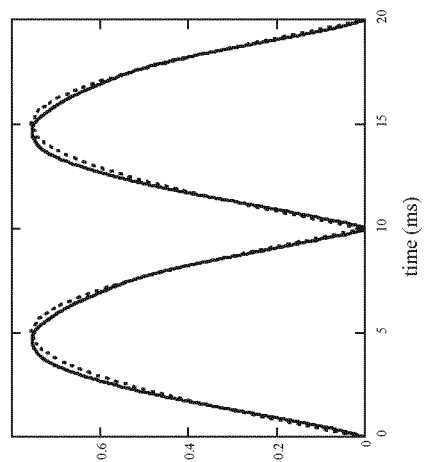

FIGS. 27 and 28 show on the left the mains current waveforms of a design resulting from the control of FIG. 17 or 19 as modified using the correction approach described above. FIG. 27 is for 230V(AC) and FIG. 28 is for 305V (AC).

The right graphs in FIGS. 27 and 28 show the modifications implemented by the correction functions.

They show that the set point for the resonant capacitor voltage (vC_ref, y-axis) at which switching of the inverters switches is triggered is no longer proportional to the mains voltage (vm, x-axis). The effect of the correction is to slightly increase the gain (i.e. the slop of the curve shown) d(vC_ref)/d(vm) at lower and medium mains voltages with an amplitude that increases with the mains voltage amplitude (vC_pk). The gain decreases for higher mains voltages so that the reference set point is the same at the maximum mains voltage. Thus, the proportional line is bowed towards a higher reference voltage vC_ref.

The resulting harmonic distortion of the mains current can be reduced to below 4%. The total harmonic distortions (THDs) are 2.5% and 3.5% for FIGS. 27 and 28 respectively.

A sixth aspect provides a further alternative switching control approach.

A self-oscillating, switching threshold control for the LLC-PFC has been described above to overcome problems that the conventional frequency control (whereby the switching frequency is the manipulating value) of the LLC as DC/DC converter turns out to be impractical in the case of the LLC-PFC circuit, namely as an AC/DC converter. Approaches described above make use of a switching threshold (for example of the resonant capacitor voltage) in order to control the mains current without measuring it.

It is known that a self-oscillating control scheme can be applied to symmetrically and asymmetrically operate resonant DC/DC converters (U.S. Pat. No. 8,729,830B2). It is also known that the capacitor voltage can be used as a feedback signal to improve the frequency control of a symmetrically operating, resonant LLC or LCC converter, for balancing the output current (U.S. Pat. No. 6,711,034B2), and for compensating the gain variation at high-load operation (US2007/0171679A1).

This sixth aspect addresses stability issues related to the control of the AC/DC power conversion with a resonant LLC converter and provides an alternative to the self-oscillating threshold control scheme described above.

This aspect relates to the general architecture shown in FIG. 6 or FIG. 15 described above, which shows the LLC converter used as an AC/DC converter. The output voltage (vo) is controlled in an outer control loop, or alternatively, the output current. The input current is controlled to implement power factor correction.

Figure 29:
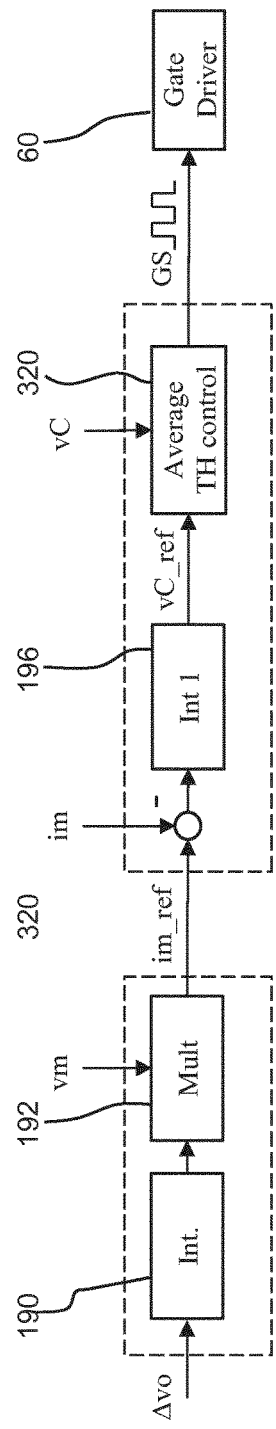
FIG. 29 shows an approach based on average threshold control.

FIG. 29 shows an implementation in schematic form. It is shown as a modification to the approach of FIG. 16 and the same components as in FIG. 16 are given the same reference numbers. In this example, the input current im is used as a controlled variable (as in FIG. 6), which is then used to derive the vC_ref signal (in the manner explained with reference to FIG. 18). The threshold voltage vC_off (shown in FIG. 20) is explicitly controlled, but this is not performed in a cycle-by cycle-manner but averaged in time. Thus, there is average threshold control as shown by unit 320.

The average threshold control unit 320 receives the reference threshold value (vC_ref) and the measured value vC and generates the gate drive signal GS.

Figure 30:
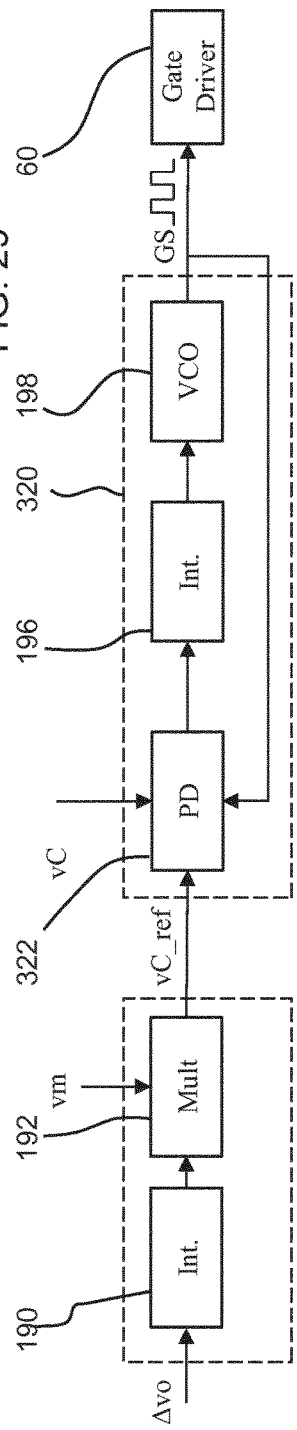
FIG. 30 shows an implementation that uses a modified VCO drive signal to implement the approach of FIG. 29.

FIG. 30 shows an implementation which does not use input current measurement and therefore suitable for the circuit of FIG. 16. The output signal GS is generated by a local oscillator 198. This implementation for PFC uses the simplified mains current control (of FIG. 19) and additionally uses an oscillator.

The system can be implemented using standard power factor controller ICs.

The phases of the VCO output signal (i.e. the signal GS provided to the gate driver 60) are compared with the resonant capacitor voltage vC by means of a phase detector 322.

Figure 31:
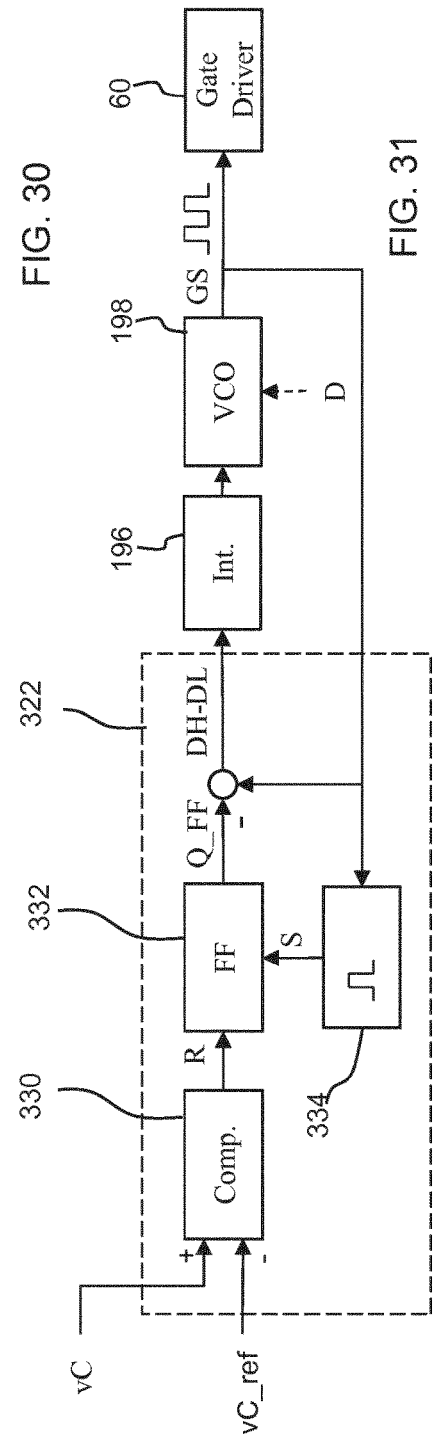
FIG. 31 shows a possible set-up of the phase detector used in FIG. 30.

FIG. 31 shows a possible set-up of the phase detector 322 in more detail.

The multiplier 192 of the outer control loop of the PFC control outputs the reference signal vC_ref proportional to the integrated output voltage error and to the mains voltage vm. The capacitor voltage vC is compared with the reference vC_ref (which in this example is vC_off) by comparator 330, which generates the reset signal for a flip-flop 332. If the resonant capacitor voltage vC exceeds the reference, the flip flop 332 is reset, and it is set again at the next rising edge of the VCO output GS.

The resulting phase error signal (DH or DL) is integrated by integrator 196 to create the error signal which controls the VCO.

In these examples, the control circuit comprises an outer control loop 190, 192 for setting a threshold level in dependence on the output voltage or current and the input voltage, and an inner control loop comprising an oscillator 198 for generating the gate drive signal, wherein the oscillator frequency is controlled by the inner control loop in dependence on the threshold level vC_ref and on the electrical feedback parameter vC. This provides an average threshold control scheme. It overcomes stability issues of direct or cycle-by-cycle threshold schemes, but maintains the advantages of threshold control in terms of relaxing the gain ratio problem associated with the frequency control.

Figure 32:
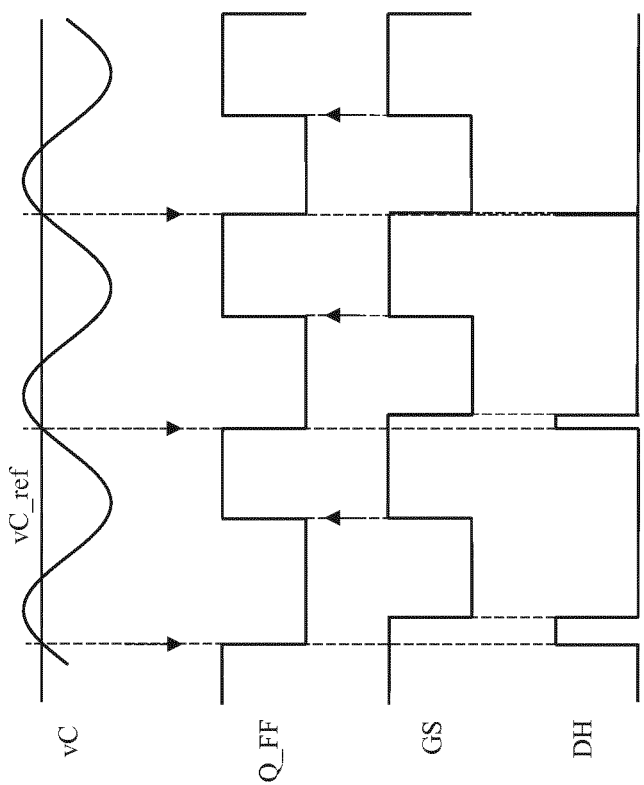

FIG. 32 shows signals of the phase detector for an implementation example in case of a transient resulting in an (initially) too low frequency of the VCO.

Figure 33:
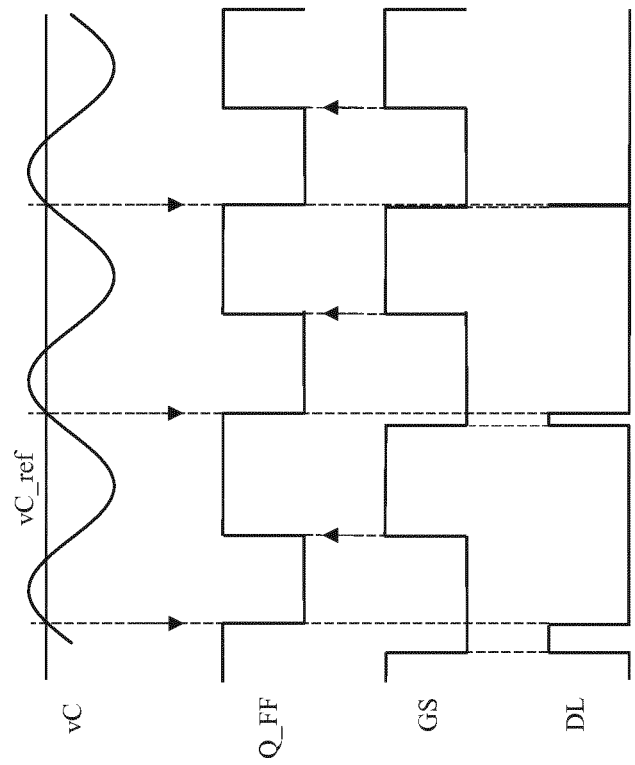
FIGS. 32 and 33 show timing diagrams to explain the operation of the circuits of FIGS. 29 to 31.

FIG. 33 shows signals of the phase detector for an implementation example in case of a transient resulting in an (initially) too high frequency of the VCO.

In FIG. 32, a too high frequency of the VCO can be a result of a transient event like a load step or during start up. The threshold vC_ref causes resetting of the flip-flop 332 whereas it is set by the VCO output signal GS. This signal always has a constant duty cycle (here 50%). Now, the case is detected when the output of the flip-flop 332 (Q_FF) is low and GS is (still) high. This detection signal (DH) is used to forms the VCO input voltage and thus results in an increased frequency, which at the second event of FIG. 32 already has led to a reduced phase error, and which vanished at the third event.

FIG. 33 shows the inverted case of an initially too high frequency, which is sensed in corresponding manner in terms of a signal DL that causes the VCO input voltage to decrease.

These waveforms are simply for illustration. The output signal of the low side gate driver for example can also be used (e.g. in the absence of signal GS), which is inverted with respect to GS. Also other means to form the phase error than the implied logic gates can also result in the desired VCO control voltage. Further possible is a completely digital implementation using a micro controller unit.

The phase detector 322 can be configured to result in the half-bridge switching action before, at, or after the actual threshold crossing for example by a slight offset to the error integrator in order to cope with delays and to achieve the desired control performance.

The VCO can further be manipulated in order to run asymmetrically, i.e., at a duty cycle below or above 50%.

Figure 35:
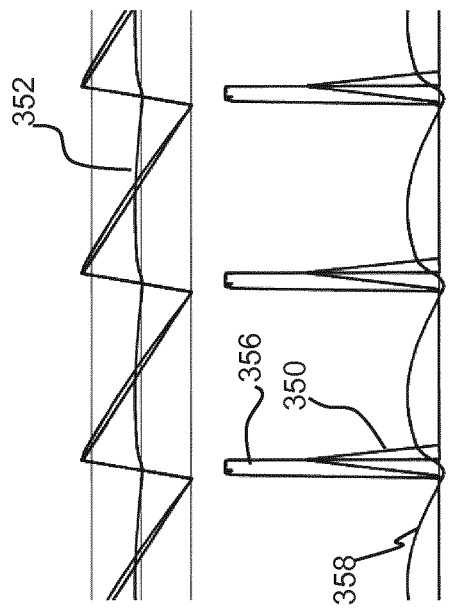
FIGS. 34 and 35 show waveforms for high voltage and part load operation.
Figure 34:
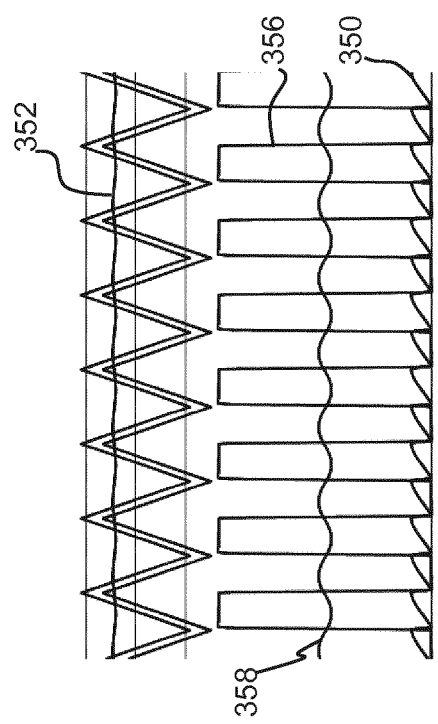

FIGS. 34 and 35 show waveforms which form high voltage and part load operation (305V(AC) at 20% of the rated load) of a converter that is designed to handle 108V (AC) to 305V (AV). FIG. 34 shows waveforms without duty-cycle modification resulting in a switching frequency of 312 kHz. FIG. 35 correspond to the same operation point but at a duty-cycle of 10% instead of 50% and result in a reduced switching frequency of 125 kHz.

A seventh aspect relates to stability issues.

When using the threshold detection schemes described above in a resonant converter, the relevant state variable(s) (vC in the main examples) may fail to achieve the desired threshold, and hence the converter may stop oscillating. This may occur at an initial startup or during operation, e.g., in connection with mains dips, load steps or during light load operation.

This aspect relates to a method whereby the threshold for the state variable is reset to a low value if a sufficiently long time elapses without any switching action in the inverter half-bridge.

For this purpose, during startup or if the state variable does not reach the desired threshold for some reason, a timeout condition is triggered which immediately lowers the threshold to zero so that switching may begin again.

Figure 36:
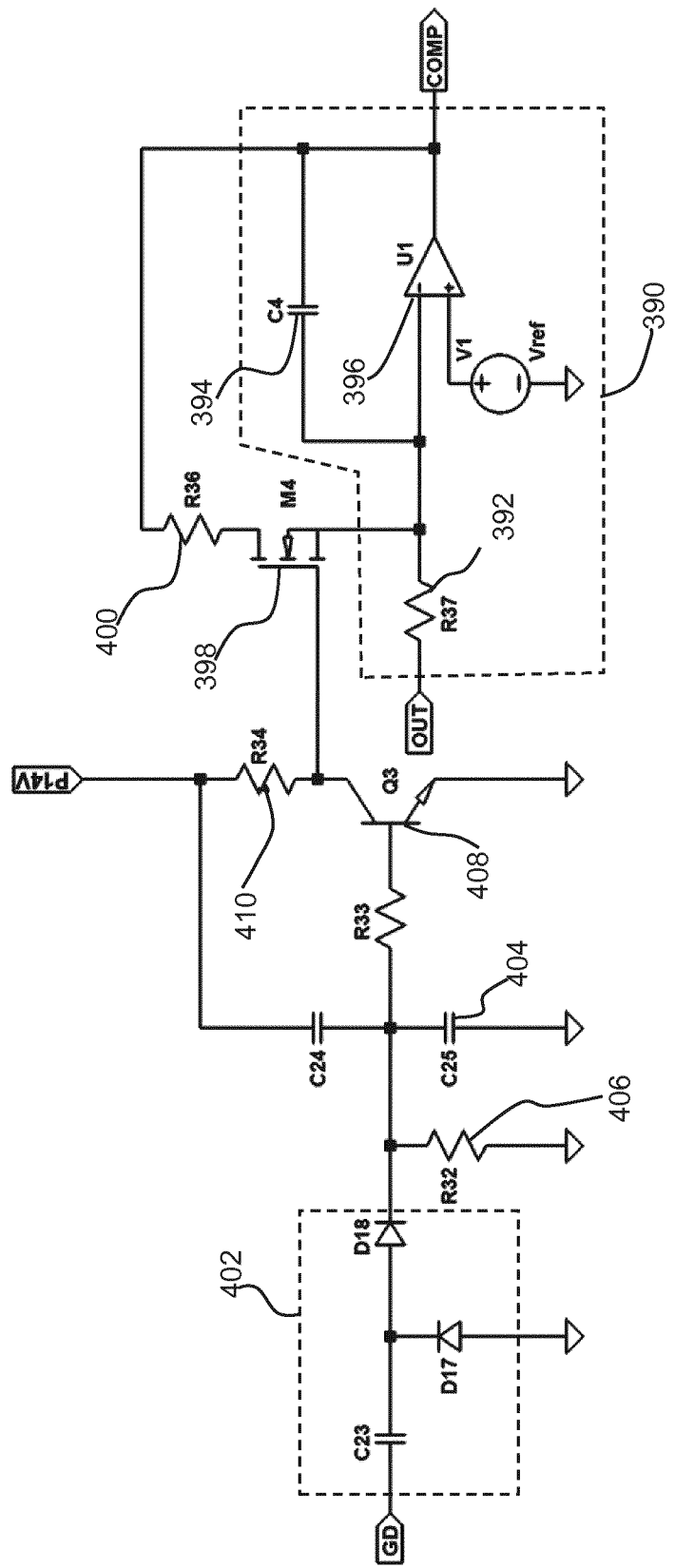
FIG. 36 shows a timeout control circuit.

An example of one embodiment of such a timeout circuit is shown in FIG. 36. The state of the half-bridge is indicated by the gate drive signal GS. As in the examples above, GS is high if the half-bridge is high, and is low otherwise. The control is for example based on an integration of the error in the output voltage which the controller is trying to regulate, shown as "OUT" in FIG. 36.

In the examples above, this signal is the output voltage (or current). However, this timeout aspect is more general, and hence the signal used as the control parameter is generally termed "OUT" in FIG. 39, and the reference (which is vo_ref in FIG. 6 for example) is generally termed "Vref" in FIG. 36.

The circuit comprises an integrator 390 (formed of input resistor 392 (R37), integrating capacitor 394 (C4) and amplifier 396). The output integrated comparison signal "COMP", or some function of the signal "COMP", defines the desired threshold value.

The threshold is generated by the product of the signal COMP and the instantaneous, rectified mains voltage (vm). COMP is the signal at the output of the integrator block for example as shown in FIG. 16 as unit 190.

The oscillation is restarted if too much time has elapsed since the last positive edge on the signal GS. For the restart, the target value of the threshold is reset (i.e., set to zero) in order to ensure a subsequent threshold crossing and thus re-initiating the oscillation. In particular, this aspect provides a timeout circuit for overriding the threshold if switching of the gate drive signal fails thereby to provide a restart signal for restarting switching of the gate drive signal.

In this example, the restart is implemented by shorting out the feedback capacitor 394. This is achieved via a MOSFET 398 which discharges the capacitor through a resistor 400 in order to keep current limited to reasonable values. In practice, the resistor 400 may be omitted if the other components are able to handle the resultant current.

The rising edges on the signal GS are detected via a detection circuit 402 (C23, D17, and D18). Each rising edge serves to charge a capacitor 404 (C25) by a small amount. In addition, there is a slow discharge via a discharge resistor 406 (R32) and in normal operation via the base of transistor 408 through the base resistor (R33).

In normal operation, the charging action exceeds the discharging action, and the voltage across the capacitor 404 is enough to maintain transistor 408 in the on-state. In turn, this keeps the transistor 398 in the off-state. If too much time elapses between rising edges on the signal GD, eventually the capacitor 404 will discharge to the point at which the transistor 408 finally turns off. This will pull the gate of transistor 398 up via pull up resistor 410 (R34), and capacitor 394 will be discharged. The voltage threshold for the capacitor voltage then reduces to near-zero, so the converter will begin operation once again.

The capacitor 412 (C24) provides a reset each time the supply, P14V, is ramped up.

Other embodiments may be realized by detecting negative edges on the signal "GD", detecting both edges on "GD" or using a more complicated feedback network between the inverting input of the amplifier 396 and the output signal "COMP" but where the integration part is still shorted out at timeout.

The restart may be adapted to occur recurrently in the case of a light load or standby operation. In these cases, there will be expected times at which the oscillation will stop, and then the timeout will provide a means to enter a type of burst mode operation, i.e., the energy is delivered during the first switching periods after the restart until eventually a threshold is missed, and then oscillation will only begin again once the timeout is triggered (due to sufficiently re-charging the buffer). In this mode, the time constant of the timeout determines the bursting frequency.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A converter, comprising:
   a half bridge inverter comprising a first switch and a second switch, wherein an output is defined from a node between the first and second switch;
   a self-oscillating LLC circuit coupled to the output, wherein an electrical feedback parameter is provided by the self-oscillating LLC circuit, wherein at a first moment in time the electrical feedback parameter is equal to the value of a predefined electrical feedback parameter threshold and wherein the slope of the electrical feedback parameter has a sign equal to that of the sign of the electrical feedback parameter threshold and at a second moment in time the electrical feedback parameter is equal to the value of the electrical feedback parameter threshold and wherein the slope of the electrical feedback parameter has a sign opposite to that of the sign of the electrical feedback parameter threshold;
   a control circuit for generating a gate drive signal for controlling the switching of the first switch and the second switch in dependence on a comparison between the electrical feedback parameter with said predefined electrical feedback parameter threshold, whereby a high gate drive signal turns on the first switch and turns off the second switch and a low gate drive signal turns off the first switch and turns on the second switch, wherein the control circuit comprises:
a detecting circuit for detecting a sign of a slope of the electrical feedback parameter; and
a preventing circuit for preventing a change in the gate drive signal starting after the first moment in time and before the second moment in time and ending after the second moment in time and before the next first moment in time.

2. The converter as claimed in claim 1, wherein the self-oscillating circuit comprises an LLC circuit and wherein the electrical feedback parameter comprises a voltage across a capacitor of the LLC circuit.

3. The converter as claimed in claim 1, wherein the preventing circuit comprises a shorting circuit for shorting the sensed electrical feedback parameter to a reference potential.

4. The converter as claimed in claim 3, wherein the detecting circuit comprises a bipolar transistor having a base connected to one terminal of an integrating capacitor, with the other terminal of the integrating capacitor connected to the feedback electrical signal, such that the base current is dependent on the slope of the voltage applied the integrating capacitor, such that in one mode the bipolar transistor is open circuit and in another mode it performs a pull up or pull down function.

5. The converter as claimed in claim 3, wherein the detecting circuit comprises a buffer circuit having an input connected to one terminal of an integrating capacitor and to a diode arrangement, with the other terminal of the integrating capacitor connected to the feedback electrical signal, arranged such that a direction of current flow through the diode arrangement is dependent on the slope of the voltage applied to the integrating capacitor, such that in one mode the input to the buffer is pulled down and in another mode the input to the buffer is pulled up.

6. The converter as claimed in claim 1 comprising a logic arrangement for implementing an OR function between the slope of the electrical feedback parameter and the level of the gate drive signal.

7. The converter as claimed in claim 1, comprising a transformer between the self-oscillating circuit and an output load.

8. An AC/DC PFC converter comprising:
an AC input;
a rectifier; and
the converter as claimed in claim 1 having as an input and the output of the rectifier.

9. An apparatus comprising:
the converter as claimed in claim 1; and
an output load.

10. The apparatus as claimed in claim 9 where the output load is an LED arrangement of one or more LEDs.

11. A conversion method, comprising:
operating a half bridge inverter comprising a first switch and a second switch using a gate drive signal and providing an output from a node between the first and second switch, wherein a high gate drive signal turns on the first switch and turns off the second switch and a low gate drive signal turns off the first switch and turns on the second switch;
providing an electrical feedback parameter from a self-oscillating circuit coupled to the output;
controlling the switching of the first switch and the second switch in dependence on a comparison between the electrical feedback parameter with a predefined electrical feedback parameter threshold, by:
detecting a sign of a slope of the electrical feedback parameter; and
disabling the electrical feedback parameter during a period of time, the period of time at least including the moment wherein the value of the electrical feedback parameter is equal to the value of the electrical feedback parameter threshold but wherein the slope of the electrical feedback parameter has a sign opposite to that of the value of the electrical feedback parameter threshold.

12. The method as claimed in claim 11, wherein the self-oscillating circuit comprises an LLC circuit and the electrical feedback parameter comprises a voltage across a capacitor of the LLC circuit.

13. The method as claimed in claim 11, wherein the disabling comprises shorting the sensed electrical feedback parameter to a reference potential.

14. The method as claimed in claim 13, wherein the detecting comprises:
controlling a base current of a bipolar transistor in dependence on the slope of the voltage applied to an integrating capacitor at the base of the bipolar transistor such that in one mode the bipolar transistor is open circuit and in another mode it performs a pull up or pull down function.

15. An LED driving method comprising rectifying an AC input, and providing conversion using the method of claim 11 to implement power factor correction, and driving an LED load using the converted DC voltage.

* * * * *